(12) United States Patent
Abdallah et al.

(10) Patent No.: US 6,502,115 B2
(45) Date of Patent: *Dec. 31, 2002

(54) CONVERSION BETWEEN PACKED FLOATING POINT DATA AND PACKED 32-BIT INTEGER DATA IN DIFFERENT ARCHITECTURAL REGISTERS

(75) Inventors: Mohammad A. F. Abdallah, Folsom, CA (US); Hsien-Cheng E. Hsieh, Gold River, CA (US); Thomas R. Huff, Portland, OR (US); Vladimir Pentkovski, Folsom, CA (US); Patrice Roussel, Portland, OR (US); Shreekant S. Thakkar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 36 days.

This patent is subject to a terminal disclaimer.

(21) Appl. No.: 09/845,610

(22) Filed: Apr. 27, 2001

(65) Prior Publication Data

US 2001/0023480 A1 Sep. 20, 2001

Related U.S. Application Data

(63) Continuation of application No. 09/070,891, filed on Apr. 30, 1998, now Pat. No. 6,266,769.

(51) Int. Cl.[7] .................................................. G06F 7/00
(52) U.S. Cl. ....................................... 708/204; 712/220
(58) Field of Search ........................... 708/204; 345/561, 345/523; 712/220, 221, 229

(56) References Cited

U.S. PATENT DOCUMENTS

| 3,872,442 | A |   | 3/1975  | Boles et al. ............. 340/172.5 |
| 4,949,291 | A |   | 8/1990  | Saini ..................... 364/715.03 |
| 5,157,388 | A |   | 10/1992 | Kohn ........................ 340/800 |
| 5,257,215 | A |   | 10/1993 | Poon ........................ 708/204 |
| 5,303,174 | A |   | 4/1994  | Okamoto .................... 708/505 |
| 5,404,469 | A |   | 4/1995  | Chung et al. ............... 395/375 |
| 5,528,741 | A |   | 6/1996  | Lucas ....................... 345/593 |
| 5,627,773 | A |   | 5/1997  | Wolrich et al. ............. 708/204 |
| 5,673,407 | A |   | 9/1997  | Poland et al. .............. 712/222 |
| 5,696,709 | A |   | 12/1997 | Smith, Sr. .................. 708/551 |
| 5,721,855 | A |   | 2/1998  | Hinton et al. .............. 712/218 |
| 5,729,724 | A |   | 3/1998  | Sharangpani et al. ....... 712/222 |
| 5,740,093 | A |   | 4/1998  | Sharangpani ............... 708/513 |
| 5,761,103 | A |   | 6/1998  | Oakland et al. ............ 708/497 |
| 5,764,548 | A |   | 6/1998  | Keith et al. ............... 708/204 |
| 5,768,170 | A |   | 6/1998  | Smith ....................... 708/504 |
| 5,802,219 | A |   | 9/1998  | Farkas et al. .............. 382/276 |
| 5,805,475 | A | * | 9/1998  | Putrino et al. ............. 708/204 |
| 5,805,486 | A |   | 9/1998  | Sharangpani ............... 708/524 |
| 5,848,284 | A |   | 12/1998 | Sharangpani ................ 712/1 |

(List continued on next page.)

FOREIGN PATENT DOCUMENTS

DE          22 20 329 C3    11/1982    ............. G06F/5/02
WO          WO99/23548      5/1999

OTHER PUBLICATIONS

Darley, M. et al, "The TMS390C602A Floating–Point Coprocessor for Sparc Systems", IEEE MICRO, Jun. 1990, pp. 36–47.

(List continued on next page.)

Primary Examiner—John F. Niebling
Assistant Examiner—Stacy Whitmore
(74) Attorney, Agent, or Firm—Blakely, Sokoloff, Taylor & Zafman LLP

(57) ABSTRACT

A method and instruction for converting a number between a floating point format and an integer format are described. Numbers are stored in the integer format in a register of a first set of architectural registers in a packed format. At least one of the numbers in the integer format is converted to at least one number in the floating point format. The numbers in the floating point format are placed in a register of a second set of architectural registers in a packed format.

55 Claims, 19 Drawing Sheets

U.S. PATENT DOCUMENTS

| | | | | |
|---|---|---|---|---|
| 5,852,726 | A | | 12/1998 | Lin et al. ..................... 712/200 |
| 5,874,969 | A | | 2/1999 | Storm et al. ................ 345/505 |
| 5,892,697 | A | * | 4/1999 | Brakefield .................. 708/204 |
| 5,933,160 | A | | 8/1999 | Kabir et al. ................ 345/524 |
| 5,968,116 | A | | 10/1999 | Day, II et al. .............. 709/202 |
| 5,978,901 | A | | 11/1999 | Luedtke et al. ............. 712/222 |
| 5,995,122 | A | | 11/1999 | Hsieh et al. ................ 345/561 |
| 6,058,465 | A | | 3/2000 | Nguyen .......................... 712/7 |
| 6,061,782 | A | | 8/2000 | Elliot et al. ................. 712/222 |
| 6,131,104 | A | * | 10/2000 | Oberman .................... 708/204 |
| 6,195,672 | B1 | * | 2/2001 | Gouger et al. .............. 708/204 |
| 6,247,116 | B1 | * | 6/2001 | Abdallah et al. ........... 712/221 |
| 6,263,426 | B1 | * | 7/2001 | Abdallah et al. ........... 345/563 |
| 6,266,686 | B1 | * | 7/2001 | Bistry et al. ................ 708/204 |
| 6,266,769 | B1 | * | 7/2001 | Abdallah et al. ........... 345/563 |
| 6,282,554 | B1 | * | 8/2001 | Abdallah et al. ........... 708/204 |
| 6,292,815 | B1 | * | 9/2001 | Abdallah et al. ........... 708/204 |

OTHER PUBLICATIONS

Gilliam, K. et al, "Design and Architecture for a MultiMode Pipelined,. Floating–Point Adder", Proceedings of the IEE, 1991, pp. 73–76.

Alpha Architecture Handbook Version 3, 1996, pp. 4–79—4-116.

"Mechanism to Clamp and Pack Lit Floating–point Color", IBM Technical Disclosure.

"Hyperspeed Product Benchmarks—X860/XP860", Apr. 3, 1996, at www.5electricity.com/hyperspd.i860bnch.html.

AMD–K6 Processor Data Sheet, 1998 Advanced Micro Devices, Inc. pp. 21–38.

AMD–3D Tecvhnology Manual, 1998 Advanced Micro Devices, Inc. pp.19,20 and 51.

"MIPS V Instruction Set"; Rev. 1.0; pp. B–1, B–2, B–18.

"MIPS Digital Media Extension"; Rev. 1.0; pp.C–1, C–2.

SunMicrosystems; Visual Instruction Set (VIS™).

Bistry, et al.; "The Comlete Guide to MMXtm Technology"; 1997; Chapter 1 –pp.2–22.

Bistry, et al.; "The Complete Guide to MMX™ Technology";1997;Chapter 2–pp. 24–34.

Bistry, et al.; "The Complete Guide to MMX™ Technology";1997;Chapter 4–pp. 54–65.

Bistry, et al.; "The Complete Guide to MMX™ Technology";1997;Chapter 5–pp. 68–110.

Bistry, et al.; "The Complete Guide to MMX™ Technology";1997; Appendix—pp. 257–268.

Tom Shanley; "Pentium Pro$^R$ and Pentium$^R$ II System Architecture"; 1998 Chapter 18—pp. 379–40.

Tom Shanley; "Pentium Pro$^R$ and Pentium$^R$ II System Architecture"; 1998 Chapter 26—pp. 507–520.

Rohan Coelho, et al. "Direct X$^R$ , RDX, RSX, and MMX™Technology a Jumpstart Guide to High Performance API's"; 1998; Chapter 18—pp. 277–286.

Rohan Coelho, et al. "Direct X$^R$ , RDX, RSX, and MMX™Technology a Jumpstart Guide to High Performance API's"; 1998; Chapter 19 pp. 289–308.

Rohan Coelho, et al. "Direct X$^R$ , RDX, RSX, and MMX™Technology a Jumpstart Guide to High Performance API's"; 1998; Chapter 20 pp. 311–330.

Rohan Coelho, et al. "Direct X$^R$ , RDX, RSX, and MMX™Technology a Jumpstart Guide to High Performance API's"; 1998; Chapter 22 pp. 349–371.

U.S. patent application Ser. No. 09/070,891, filed Apr. 30, 1998.

U.S. patent application Ser. No. 09/070,900, filed Apr. 30, 1998.

U.S. patent application Ser. No. 09/069,796, filed Apr. 30, 1998.

U.S. patent application Ser. No. 09/071,466, filed Apr. 30, 1998.

U.S. patent application Ser. No. 09/071,001, filed Apr. 30, 1998.

U.S. patent application Ser. No. 09/071,468, filed Apr. 30, 1998.

* cited by examiner

CONVERSION BETWEEN PACKED FLOATING POINT DATA AND PACKED 32-BIT INTEGER DATA IN DIFFERENT ARCHITECTURAL REGISTERS

This is a continuation of application Ser. No. 09/070,891, filed on Apr. 30, 1998 now U.S. Pat. No. 6,266,769.

FIELD OF THE INVENTION

The present invention relates generally to the parallel manipulation of data and, more particularly, to the parallel conversion of data between data formats in different architectural registers.

BACKGROUND OF THE INVENTION

In typical computer systems, processors are implemented to operate on values represented by a large number of bits, for example, 32-bits, using instructions that produce one result. For example, the execution of an add instruction will add together a first 32-bit value and a second 32-bit value and store the result as a third 32-bit value. Some applications, however, require the manipulation of large amounts of data represented by fewer than 32 bits. Multimedia graphics, for instance, are typically generated by treating an image as a collection of small, independently controlled dots, or pixels. Position coordinates and color values corresponding to pixels are typically represented by fewer than 32 bits. The processing of the large amounts of data through a pipeline required by graphics applications can greatly increase processing time and slow graphics rendering correspondingly.

Multimedia graphics applications include, but are not limited to, applications targeted at computer supported cooperation (CSC), two-dimensional (2D) graphics, three-dimensional (3D) graphics, image processing, video compression/decompression, recognition algorithms and audio manipulation. As such, the data of multimedia applications typically comprises still images or video frames and sound data. The pixels of the still image or video data are typically represented using 8- or 16-bit data elements, and the sound data is typically represented using 8- or 16-bit data elements. When processing multimedia data comprising still images or video frames, the same operation is often performed repeatedly over all of the pixels of the image or of the frame. As each of these multimedia applications typically use one or more algorithms, and each algorithm typically uses a number of operations, multimedia extensions used to execute the same operations on 8-bit, 16-bit, or even 32-bit data while processing two, four, or eight data samples at a time speeds up computations that exhibit data parallelism.

To improve efficiency of multimedia applications, as well as other applications having similar characteristics, prior art processors use packed data formats. A packed data format is one in which a certain number of fixed sized data elements, each of which represents a separate value, are stored together. For example, a 64-bit register may be broken into two 32-bit elements, each of which represents a separate 32-bit value. In addition, these prior art processors provide instructions for separately manipulating each element in these packed data types in parallel. For example, a packed add instruction adds together corresponding data elements from a first packed data and a second packed data. Thus, if a multimedia algorithm requires a loop containing five operations that must be performed on a large number of data elements, it is desirable to pack the data and perform these operations in parallel using packed data instructions. In this manner, these processors can more efficiently process multimedia applications.

Therefore, in order to reduce the time required for graphics rendering in multimedia applications, parallel processing is used, wherein a single instruction operates on multiple elements of data; this process is typically referred to as Single Instruction Multiple Data (SIMD) processing. Typically, integer instructions operate on individual integer data elements (A+B). The SIMD instructions, however, operate on integer data arrays (A[1 . . . n]+B[1 . . . n]), where n is the number of elements in the array.

Typical prior art processing systems, in rendering 2D images, used only integer data in the geometry and rasterization phases because the smaller range of coordinate values did not necessitate the precision of floating point arithmetic. Therefore, the graphics data was rendered using SIMD processing of integer data, meaning that no conversion was typically required between the integer format and the floating point format.

However, in rendering 3D images, the data manipulations performed for the geometry phase are typically performed using floating point arithmetic because of the large range of values that define the coordinate space and because of the precision required within this range to accurately place the rendered images. Because the color component data is often stored and manipulated along with the corresponding position data it is convenient to perform operations on the rasterization data comprising color component data using floating point arithmetic. Upon completion of processing, the coordinates of the composited images are provided to the rasterization circuitry using the floating point format. In contrast, the color component data is provided to the rasterization circuitry using the integer format. Therefore, the color component data used to render the image is converted from the floating point format to the integer format in order to render an image display.

The problem in the prior art processors using SIMD processing of 3D graphic data is that, while parallel processing may be performed on floating point data, the conversion of the floating point data to integer data for rasterization creates a bottleneck in the processing pipeline because the prior art algorithms perform conversions sequentially. A prior art method of dealing with this problem duplicates the floating point execution resources of the processor. This duplication of resources allows for two floating point pipelines executing at the same time wherein the floating point data of each branch of the pipeline can be sequentially converted to integer format at the same time. While the delay due to the conversion execution bottleneck may be reduced with the use of the additional hardware, the additional hardware increases the cost and size of the system while increasing the overall complexity of the system.

SUMMARY OF THE INVENTION

A method and apparatus for converting a number between a floating point format and an integer format are described. Numbers are stored in the integer format in a register of a first set of architectural registers in a packed format. At least one of the numbers in the integer format is converted to at least one number in the floating point format. The numbers in the floating point format are placed in a register of a second set of architectural registers in a packed format.

Other features and advantages of the present invention will be apparent from the accompanying drawings and from the detailed description and appended claims that follow below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
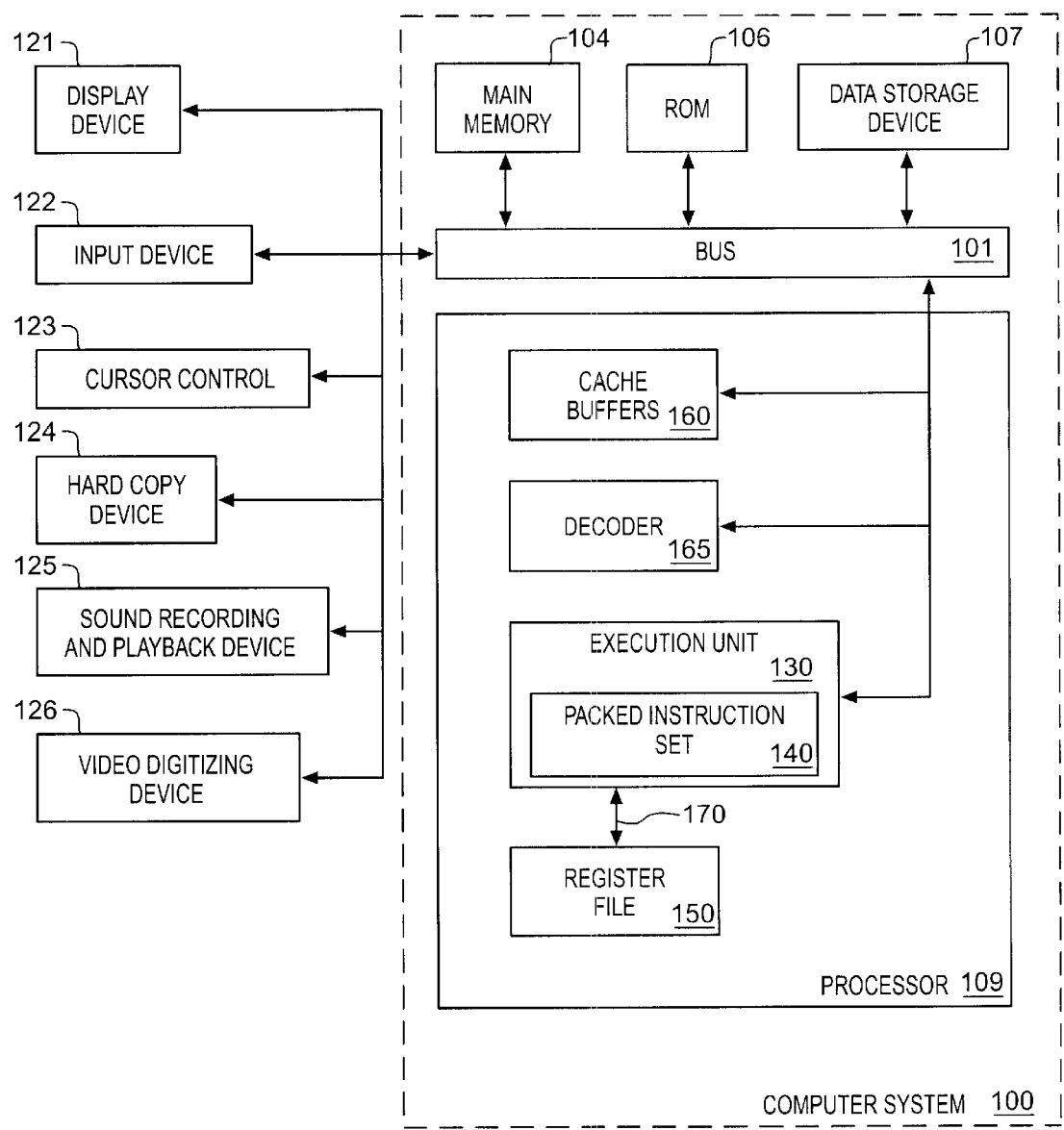
FIG. 1 is a computer system of one embodiment.

A method and apparatus for performing parallel conversion of 3D graphics data is described, wherein the graphics data is converted in parallel between different sets of architectural registers for processing. As such, scalar integer data or memory data may be converted to a packed floating point format in parallel using the instructions provided herein. The packed floating point data is manipulated to provide the graphic data used in 3D image rendering. Following manipulation, the packed floating point graphics data are converted to a packed integer format in parallel using the instructions described herein. The packed integer data are used to render an image display.

In the embodiments described, data in one format in one architectural register is converted to another format and placed in another architectural register. There are advantages realized from placing a result of a conversion in an architectural register rather than in a memory location. Placing conversion results in an architectural register makes usage models that prefer consumption of a register result are more efficient. For example, in the case of performing 3-dimensional operations using floating point single stet multiple data (SIMD) registers and performing rasterization using SIMD registers, it would be inconvenient for intermediate conversion results to be stored in memory. This is because the conversion results would be immediately required from memory, necessitating a memory access operation that would place the results back in a register. If it is ever required to move a conversion result to memory, that can be done easily with a STORE instruction.

In addition, placing conversion results in a register make the use of conversion instructions more flexible in some systems. In particular, in some processor architectures, a computation operation cannot have memory as both a source of one operand and the destination of the result. If an architectural register is the destination, as in the described embodiments, a conversion operation can have memory as an operand source.

Specifically, a method and apparatus for converting data between a packed single precision floating point format and a scalar format are described. In one embodiment, the packed single precision floating point format data are placed in architectural registers of a set of 128-bit architectural registers, while the scalar format data are placed in 32-bit architectural registers or memory. Furthermore, a method and apparatus for converting data between a packed single precision floating point format and a packed integer format are described. In one embodiment, packed 32-bit single precision floating point format data are placed in architectural registers of a set of 128-bit architectural registers, while packed 32-bit integer format data are placed in architectural registers of a set of 64-bit architectural registers. In other embodiments, architectural resisters may be of different sizes. For example, 128-bit registers may be used instead of 64-bit registers. Moreover, a method and apparatus for using the conversion instructions in the parallel conversion of multiple color component data, or values, from packed single precision floating point format to packed integer format are described. Intended advantages of the parallel conversion instructions can include reduced processing time over sequential conversion techniques, a decreased number of instructions in the processing of graphics data, no requirement for duplicated floating point execution resources, and higher application processing efficiency.

FIG. 1 is a computer system 100 of one embodiment. The computer system 100 is an example of one type of computer system that can be used with embodiments of the present invention. Other types of computer systems, not shown, that are configured differently, could also be used with embodiments of the present invention. The computer system 100 comprises a bus 101, or other communications hardware and software, for communicating information, and a processor 109 coupled to the bus 101 for processing information. The processor 109 represents a central processing unit (CPU) having any type of architecture, including complex instruction set computing (CISC) architecture or reduced instruction set computing (RISC) architecture. The processor 109 comprises an execution unit 130, a register file 150, a cache 160, a decoder 165, and an internal bus 170. The term "registers" is used herein to refer to the on-board processor storage locations that are used as part of macro-instructions to identify operands (also referred to as architectural registers). In other words, the registers referred to herein are those that are visible from the outside of the processor (from a programmers perspective). However, the registers described herein can be implemented by circuitry within a processor using any number of different techniques, such as dedicated physical registers, dynamically allocated physical registers using register renaming, combinations of dedicated and dynamically allocated physical registers, etc. The register file 150 may comprise a single register file comprising multiple architectural registers or may comprise multiple register files, each comprising multiple architectural registers.

The computer system 100 further comprises a random access memory (RAM) or other dynamic storage device in main memory 104 coupled to the bus 101 for storing information and instructions to be executed by the processor 109. The main memory 104 may be used for storing temporary variables or other intermediate information during execution of instructions by processor 109. The computer system 100 further comprises a read only memory (ROM) 106, or other static storage device, coupled to the bus 101 for storing static information and instructions for the processor 109.

A data storage device 107, such as a magnetic disk or optical disk and a corresponding disk drive, is coupled to the bus 101. The computer system 100 may be coupled via the bus 101 to a display device 121 for displaying information to a user of the computer system 100. Display device 121 can include a frame buffer, specialized graphics rendering devices, a cathode ray tube (CRT), and a flat panel display, but the invention is not so limited. An alphanumeric input device 122, including alphanumeric and other keys, may be coupled to the bus 101 for communicating information and command selections to the processor 109. Another type of user input device is a cursor control 123 comprising a mouse, a trackball, a pen, a touch screen, or cursor direction keys for communicating direction information and command selections to the processor 109, and for controlling cursor movement on the display device 121. The input device of one embodiment has two degrees of freedom in two axes, a first axis, or x-axis, and a second axis, or y-axis, which allows the input device to specify positions in a plane, but the invention is not so limited.

In one embodiment, a hard copy device 124 is coupled to the bus 101 and is used for printing instructions, data, and other information on a medium such as paper, film, or similar types of media. Additionally, the computer system 100 can be coupled to a device for sound recording and playback 125. The sound recording may be accomplished using an audio digitizer coupled to a microphone, and the sound playback may be accomplished using a speaker which is coupled to a digital to analog (D/A) converter for playing back the digitized sounds, but the invention is not so limited.

The computer system 100 can function as a terminal in a computer network, wherein the computer system 100 is a computer subsystem of a computer network, but the invention is not so limited. The computer system 100 may further include a video digitizing device 126. The video digitizing device 126 can be used to capture video images that can be transmitted to other computer systems coupled to the computer network.

In one embodiment, the processor 109 additionally supports an instruction set which is compatible with the x86 and/or x87 instruction sets, the instruction sets used by existing microprocessors such as the Pentium® processors manufactured by Intel Corporation of Santa Clara, Calif. Thus, in one embodiment, the processor 109 supports all the operations supported in the Intel Architecture (IA™), as defined by Intel Corporation of Santa Clara, Calif. See Microprocessors. Intel Data Books volume 1 and volume 2, 1992 and 1993, available from Intel of Santa Clara, Calif. As a result, the processor 109 can support existing x86 and/or x87 operations in addition to the operations of the invention. Alternative embodiments of the invention may incorporate the invention into other instruction sets.

The execution unit 130 is used for executing instructions received by the processor 109. In addition to recognizing instructions typically implemented in general purpose processors, the execution unit 130 recognizes instructions in a packed instruction set 140 for performing operations on packed data formats. In one embodiment, the packed instruction set 140 comprises instructions for supporting pack operations, unpack operations, packed add operations, packed subtract operations, packed multiply operations, packed shift operations, packed compare operations, multiply-add operations, multiply-subtract operations, population count operations, and a set of packed logical operations, but the invention is not so limited. The set of packed logical operations of one embodiment comprise packed AND, packed ANDNOT, packed OR, and packed XOR, but the invention is not so limited. While one embodiment is described wherein the packed instruction set 140 includes these instructions, alternative embodiments may comprise a subset or a super-set of these instructions.

These instructions provide for performance of the operations required by many of the algorithms used in multimedia applications that use packed data. Thus, these algorithms may be written to pack the necessary data and perform the necessary operations on the packed data, without requiring the packed data to be unpacked in order to perform one or more operations on one data element at a time. Therefore, these algorithms provide performance advantages over prior art general purpose processors that do not support the packed data operations required by certain multimedia algorithms. For example, if a multimedia algorithm requires an operation that cannot be performed on packed data, the prior art program, in contrast to the present invention, must unpack the data, perform the operation on the separate elements individually, and then pack the results into a packed result for further packed processing.

The execution unit 130 is coupled to the register file 150 using an internal bus 170. The register file 150 represents a storage area on the processor 109 for storing information, including data. Furthermore, the execution unit 130 is coupled to a cache 160 and a decoder 165. The cache 160 is used to cache data and control signals from, for example, the main memory 104. The decoder 165 is used for decoding instructions received by the processor 109 into control signals and microcode entry points. In response to these control signals and microcode entry points, the execution unit 130 performs the appropriate operations. For example, if an add instruction is received, the decoder 165 causes execution unit 130 to perform the required addition; if a subtract instruction is received, the decoder 165 causes the execution unit 130 to perform the required subtraction. Thus, while the execution of the various instructions by the decoder 165 and the execution unit 130 is represented by a series of if/then statements, the execution of an instruction of one embodiment does not require a serial processing of these if/then statements.

The register file 150 is used for storing information, including control and status information, scalar data, integer data, packed integer data, and packed floating point data. In one embodiment, the register file 150 may comprise memory registers, control and status registers, scalar integer registers, scalar floating point registers, packed single precision floating point registers, packed integer registers, and an instruction pointer register coupled to the internal bus 170, but the invention is not so limited. In one embodiment, the scalar integer registers are 32-bit registers, the packed single precision floating point registers are 128-bit registers, and the packed integer registers are 64-bit registers, but the invention is not so limited.

In one embodiment, the packed integer registers are aliased onto the same memory space as the scalar floating point registers. Separate registers are used for the packed floating point data. In using registers of register file 150, the processor 109, at any given time, must treat the registers as being either stack referenced floating point registers or non-stack referenced packed integer registers. In this embodiment, a mechanism is included to allow the processor 109 to switch between operating on registers as stack referenced floating point registers and non-stack referenced packed data registers. In another such embodiment, the processor 109 may simultaneously operate on registers as non-stack referenced floating point and packed data registers. Furthermore, in an alternate embodiment, these same registers may be used for storing scalar integer data.

Alternative embodiments may contain different sets of registers. For example, an alternative embodiment may comprise separate registers for the packed integer registers and the scalar data registers. An alternate embodiment may include a first set of registers, each for storing control and status information, and a second set of registers, each capable of storing scalar integer, packed integer, and packed floating point data.

The registers of the register file 150 may be implemented to include different numbers of registers and different size registers, but the invention is not so limited. For example, in one embodiment, the integer registers may be implemented to store 32 bits, while other registers are implemented to store 128 bits, wherein all 128 bits are used for storing floating point data while only 64 are used for packed data. In an alternate embodiment, the integer registers each contain 32 or 64 bits.

Figure 2:
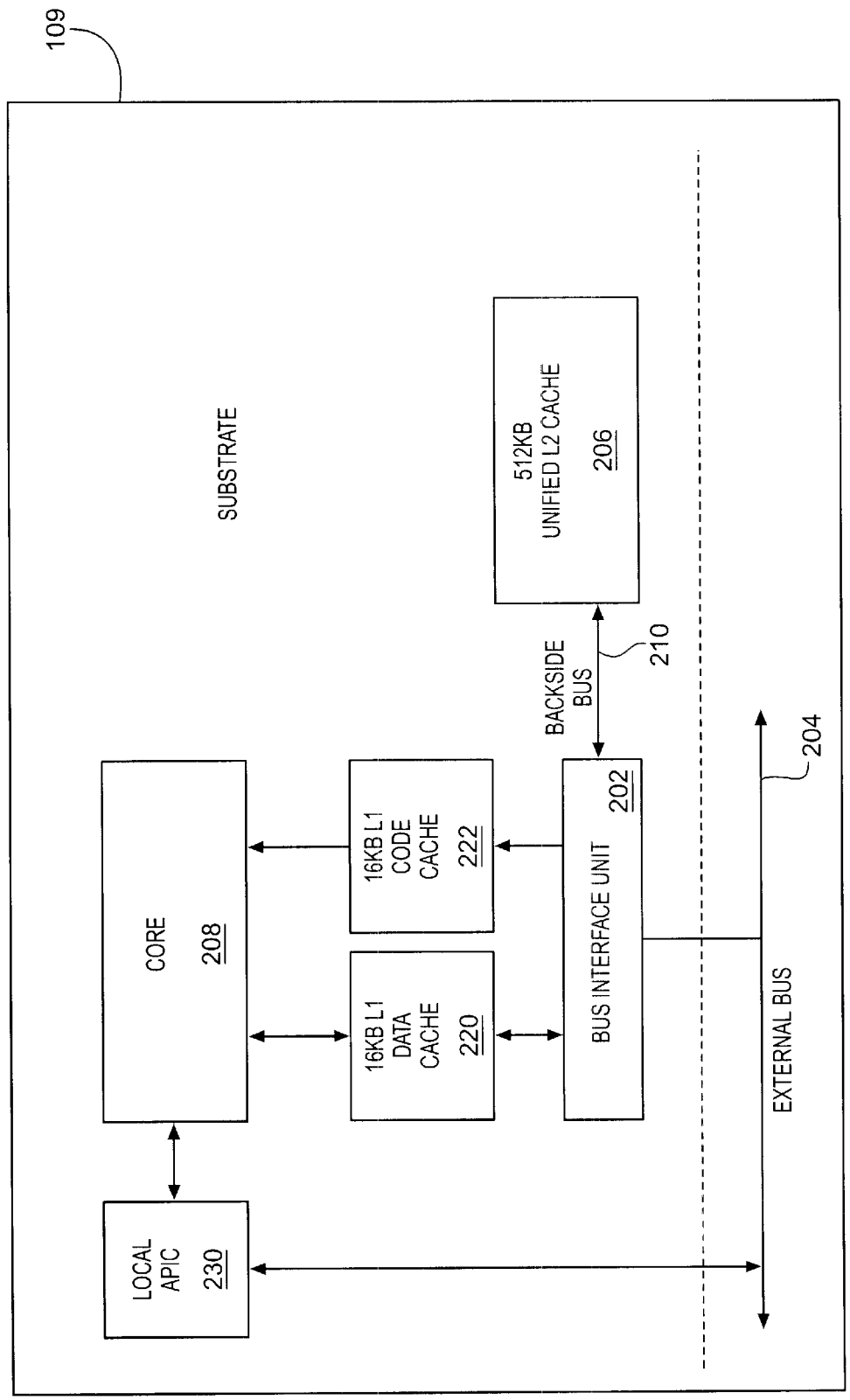
FIG. 2 is a processor of one embodiment.

FIG. 2 is a processor 109 of one embodiment. The processor 109 comprises a bus interface unit 202 that couples the processor 109 to an external bus 204, wherein the external bus 204 is used to communicate with other system devices. The bus interface unit 202 performs bus transactions when requested by the L2 cache 206 or the processor core 208. Furthermore, the bus interface unit 202 couples the processor 109 to a unified L2 cache 206 using a backside bus 210. The L2 cache 206 may be off the chip, and may run at a fraction of the speed of the core processor 208, but the invention is not so limited. The L2 cache 206 of one embodiment comprises 512 Kbytes, but the invention is not so limited. The L2 cache 206 services misses on the L1 data 220 and code 222 caches, and may issue requests to the bus interface unit 202.

The bus interface unit 202 of one embodiment is coupled to the processor core 208 using an L1 data cache 220 and an L1 code cache 222, each of which are 16 Kbytes, but the invention is not so limited. The L1 caches 220–222 are first level caches that can provide data in one clock cycle on a cache hit. A cache hit occurs when the requested data is already in the cache; otherwise a cache miss occurs, and the data is brought in from main memory or the L2, or second level, cache 206. The L1 data cache 220 services data load and store requests issued by the load and store execution units; when a miss occurs, the L1 data cache 220 forwards requests to the L2 cache 206. The L1 code cache 222 services instruction fetch requests issued by the instruction prefetcher.

The processor core 208 comprises logic responsible for: instruction fetch; branch prediction; parsing of instruction streams; decoding instructions into reduced instruction set computing (RISC) instructions, or micro-ops; mapping accesses among register sets; and dispatch, execution, and retirement of micro-ops. The processor core 208 may run at speeds of 233, 266, and 300 megahertz (MHz), but the invention is not so limited. The processor 109 supports out-of-order execution, wherein micro-ops are executed based on the readiness of their data rather than the order in which they entered the execution unit. An asynchronous processor interrupt control (APIC) unit 230 receives interrupt requests and prioritizes and forwards the requests to the processor core 208 for execution.

The processor of one embodiment is an advanced super-scalar processor built around two general-purpose integer pipelines and a pipelined floating-point unit, allowing the processor to execute two integer instructions simultaneously. The processor can issue two instructions in each clock cycle, one in each pipe, but the invention is not so limited.

Figure 3:
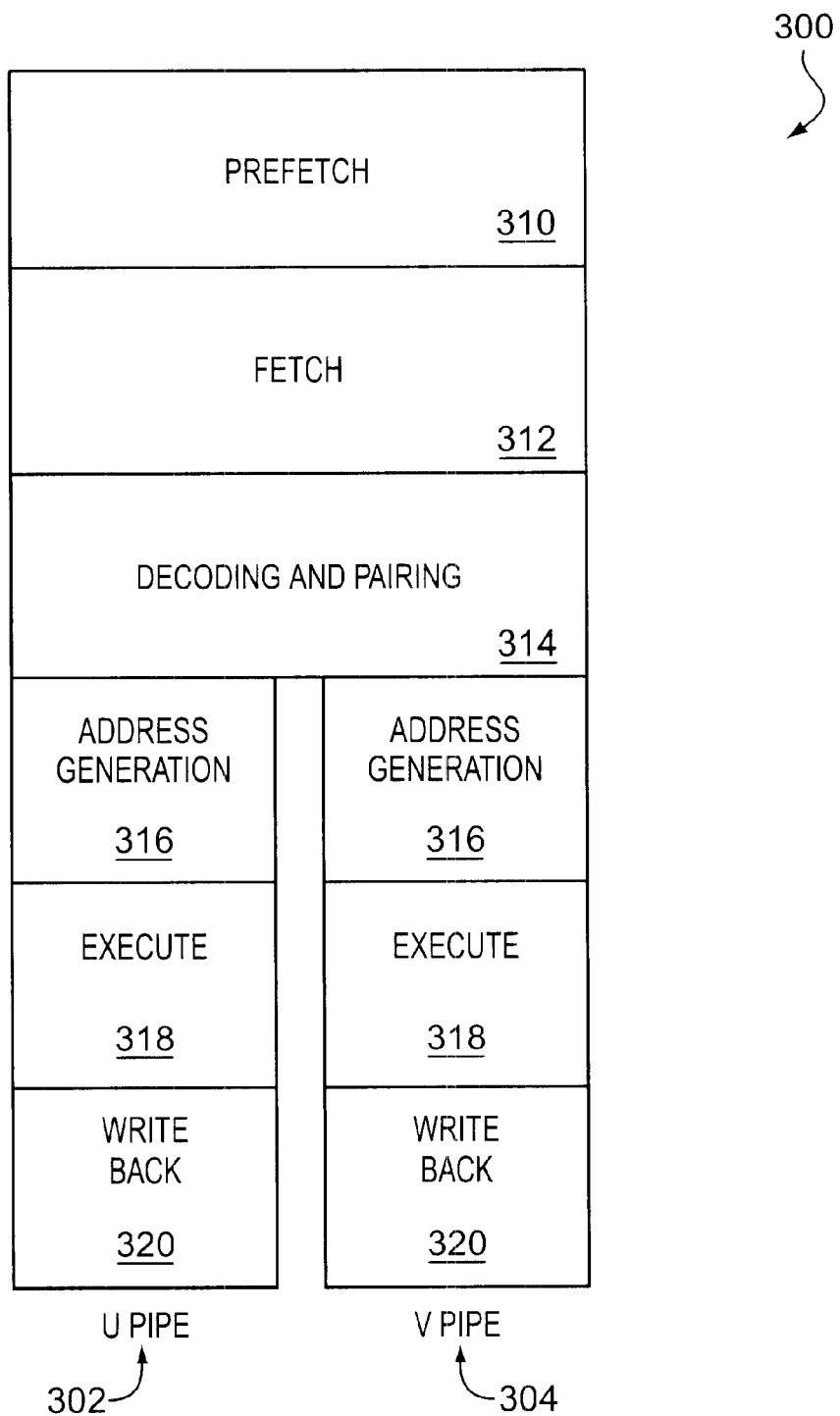
FIG. 3 is a dual data pipeline of one embodiment.

FIG. 3 is a dual data pipeline 300 of one embodiment. Other embodiments may have one pipeline or more than two pipelines. The first logical pipe is referred to as the U-pipe 302, and the second logical pipe is referred to as the V-pipe 304. During the decoding of any given instruction, the next two instructions are checked, and if possible, they are issued such that the first one executes in the U-pipe 302 and the second in the V-pipe 304.

If it is not possible to pair two instructions, the next instruction is issued to the U-pipe 302 and no instruction is issued to the V-pipe 304. When instructions execute in the two pipes 302–304, their behavior is the same as if they were executed sequentially. The processor micro-architecture comprises the following stages: instruction prefetch 310, instruction fetch 312, instruction decoding, pairing, and dispatch 314, address generation 316, operand read and execution 318, and writeback 320. Instruction decode logic decodes, schedules, and issues the instructions at a rate of up to two instructions per clock cycle.

Figure 4:
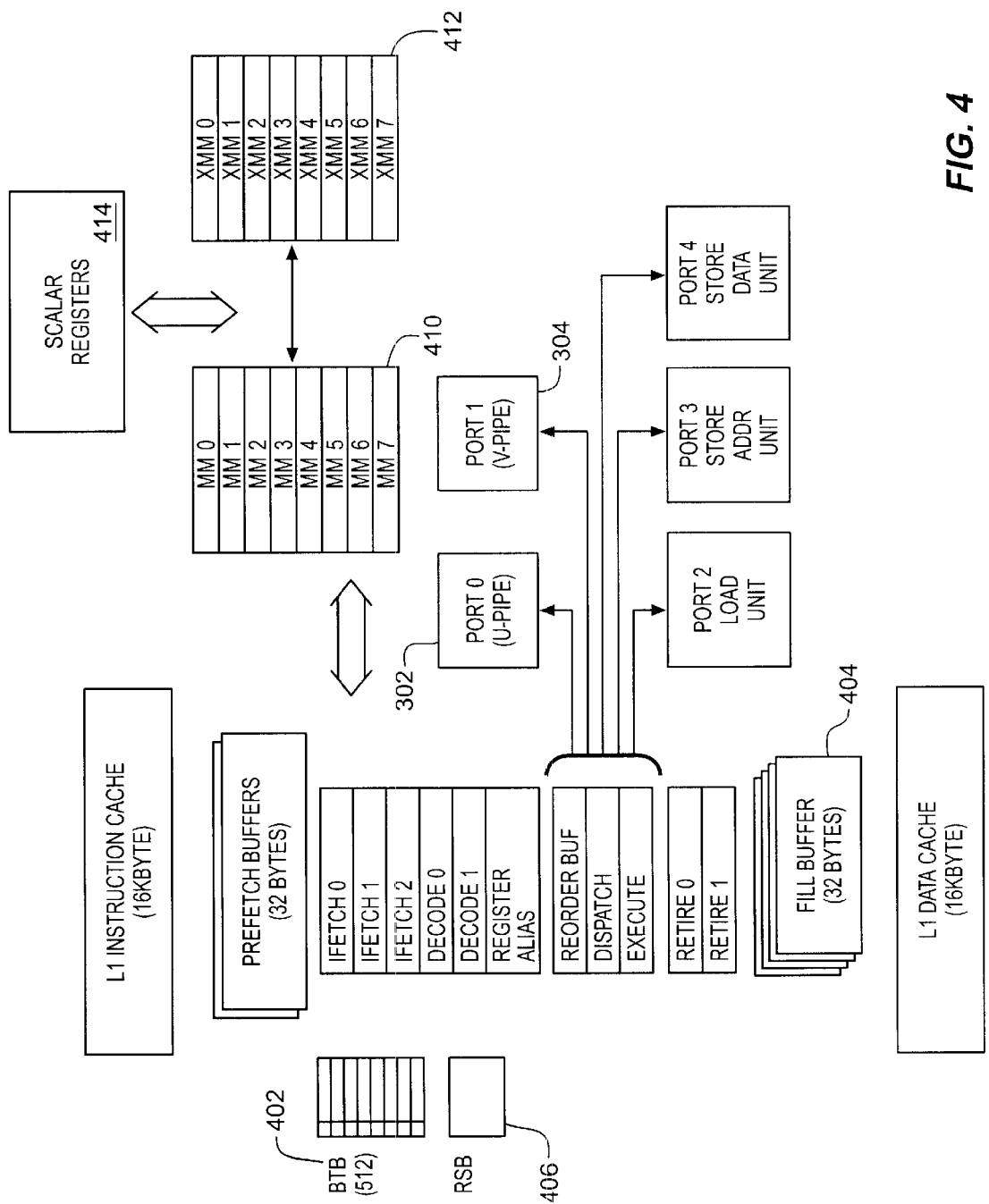
FIG. 4 is a cache architecture of a processor of one embodiment.

FIG. 4 is a cache architecture of a processor of one embodiment. The processor comprises a twelve-stage pipelined architecture with an out-of-order execution core. Furthermore, the processor of one embodiment comprises three parallel decoders, five execution ports 0–4, a branch target buffer (BTB) 402 with 512 entries, four 32-byte write buffers 404, a set of 32-bit scalar registers 414, a set of eight 64-bit registers 410, a set of eight 128-bit multimedia extension registers 412, and a return stack buffer (RSB) 406. The BTB 402 holds a history of branches that were mispredicted during the execution of an application. It stores the address of the mispredicted branch instruction, the branch target address, and the result of the misprediction. When the same instructions show up again, the branch prediction unit uses this information to predict the outcome of the branch. The RSB 406 may correctly predict return addresses for procedures that are called from different locations in succession.

As previously discussed herein, the processor comprises two execution pipelines, the U-pipe 302 and the V-pipe 304. These pipelines 302–304 operate in parallel and may sustain an execution rate of up to two instructions every clock cycle. The U-pipe 302 and the V-pipe 304 can write to any of the four write buffers 404. Furthermore, one embodiment supports pipelining, or overlapping operations. In pipelining, the processor breaks instruction execution into multiple stages comprising fetch, decode, execution, and writeback. As a result, the processor can execute multiple instructions at the same time, each in a different execution stage. For example, one instruction could be in the prefetch stage, one in decode, one in execution, and one in writeback. As previously discussed herein, parallel processing wherein a single instruction operates on multiple elements of data is often referred to as Single Instruction Multiple Data (SIMD).

The set of eight 64-bit registers 410 of one embodiment allow for parallel processing to the level where a single instruction operates on multiple elements of data. This process benefits applications that perform the same operation repetitively on contiguous blocks of data, as in multimedia algorithms. The 64-bit registers 410 may be mapped or aliased onto the registers 414, but the invention is not so limited. Because the 64-bit registers 410 are a part of the floating-point state, there is no new state. When the 64-bit registers 410 are aliased onto the 32-bit scalar registers 414, in accessing the aliased registers, multimedia extension instructions interpret the data as packed integer bytes, or words, and floating-point instructions interpret the same data as the mantissa part of a floating-point number. Equally important is that the multimedia extension instructions have access to the eight dedicated 64-bit registers 410 in addition to the eight 32-bit scalar registers 414.

Three packed data types and a 64-bit quad-word are defined for the 64-bit registers 410 of one embodiment. Each element within the packed data types is a fixed-point integer. The user controls the place of the fixed point within each element and is responsible for its placement throughout the calculation. This provides the user with the flexibility to choose and change fixed-point formats during the application in order to fully control the dynamic range of values.

The 64-bit registers 410 contain packed, fixed-point integer data. Each 64-bit multimedia extension register MM0–MM7 can be directly addressed by designating a register name in the instructions. With regard to register access, these registers MM0–MM7 become random access registers; that is, they are not accessed via a stack model as they are with the floating-point instructions. Instructions that specify a memory operand use the 32-bit scalar registers 414 to address that operand.

Because the 64-bit registers 410 actually use the floating-point registers, applications that use multimedia extension technology have 16 integer registers to use. Eight registers are the 64-bit multimedia extension floating-point registers MM0–MM7 comprising packed data, and eight registers are the 32-bit scalar registers 414, which can be used for different operations like addressing, loop control, or any other data manipulation.

Memory and integer register operations support the movement of data between the 64-bit registers 410 and the 32-bit scalar registers 414 or memory. The 32-bit and 64-bit memory access support in the U-pipe 302 is used for performing 32-bit and 64-bit memory transfers to and from the 64-bit registers 410. Furthermore, the processor uses the U-pipe 302 for transfers between the integer and multimedia processing data paths.

The instructions corresponding to the 64-bit registers 410 operate in parallel on the packed byte, packed word, packed doubleword, and quadword data types packed into 64-bit registers. The packed byte data type comprises eight packed consecutive bytes in a 64-bit register, or eight elements per operand. The packed word data type comprises four packed consecutive words in a 64-bit register, or four elements per operand. The packed doubleword data type comprises two packed consecutive double words in a 64-bit register, or two elements per operand. The quadword data type comprises one quad word in a 64-bit register, or one element per operand. The instructions perform signed and unsigned arithmetic, logical, packing, and unpacking operations on the data type boundaries. Furthermore, the instructions allow for saturation or wrap-around to handle overflow and underflow conditions. The instructions of one embodiment comprise MOVQ, POR, PSLLD, and UNPACK instructions. The MOVQ instruction transfers 64 bits among the first set of multimedia extension registers and among the first set of multimedia extension registers and memory. The POR instruction causes execution of a bitwise logical OR in the first set of multimedia extension registers. The PSLLD instruction causes execution of a shift left logical without carry across data type boundary in the first set of multimedia extension registers. The UNPACK instruction interleaves data by taking one operand from one register and one operand from a corresponding location in another register and placing both operands contiguously in a register. For example, an UNPACK HIGH instruction places the high operand of one register and the high operand of another register contiguously in a register. In one embodiment, an UNPACK instruction operates on a zero operand from one source register and a non-zero operand from another source register and places both operands in the source register of the zero operand.

The processor architecture comprising the 128-bit multimedia extension registers 412 of one embodiment further accelerates performance of 3D graphics applications over prior art multimedia extension technologies. The associated programming model uses instructions that operate on new packed floating-point data types which contain four single precision floating point numbers, but the invention is not so limited. General purpose floating point instructions are used to operate on the set of eight 128-bit multimedia extension registers XMM0–XMM7, thereby providing the programmer with the ability to develop algorithms that can finely mix packed single precision floating-point and integer data. Furthermore, instructions are introduced to control cacheability of packed floating-point data and integer data. These new instructions comprise the ability to stream data into the eight 64-bit multimedia extension registers MM0–MM7 and the eight 128-bit multimedia extension registers XMM0–XMM7 without polluting the caches. Moreover, these instructions comprise the ability to prefetch data before it is actually used. The intended advantage of packed floating point instructions is the acceleration of 3D geometry and graphics, the acceleration of 3D rendering, and the acceleration of video encoding and decoding.

In one embodiment, the Single Instruction Multiple Data (SIMD) technique is used, but the invention is not so limited. As previously discussed herein, this technique speeds up software performance by processing multiple data elements in parallel, using a single instruction. The 128-bit multimedia extension registers 412 support operations on packed single precision floating point data types, and the 64 bit registers 410 support operations on packed quadrate data types, or byte, word, and double-word data types. This approach is used because most 3D graphics and digital signal processing (DSP) applications have characteristics comprising the following: inherently parallel; wide dynamic range, hence floating-point based; regular and reoccurring memory access patterns; localized re-occurring operations performed on the data; and, data independent control flow.

In one embodiment, eight 128-bit general purpose registers XMM0–XMM7 are provided, each of which can be directly addressed. These 128-bit registers XMM0–XMM7 hold packed 128-bit data. In one embodiment, the principle data type of the 128-bit multimedia extension registers 412 is a packed single precision floating point operand, specifically four 32-bit single precision floating point numbers, but the invention is not so limited. The corresponding multimedia extension instructions access the 128-bit registers 412 directly using register names, but the invention is not so limited. The 128-bit registers 412 may be used to perform calculations on data.

The real-number system comprises the continuum of real numbers from minus infinity to plus infinity. Because the size and number of registers that any computer can have is limited, only a subset of the real-number continuum can be used in real-number calculations. As the subset of real numbers that a particular processor supports represents an approximation of the real-number system, the range and precision of this real-number subset is determined by the format that the processor uses to represent real numbers. To increase the speed and efficiency of real-number computations, computers typically represent real numbers in a binary floating-point format. In this format, a real number has three parts: a sign, a significand, and an exponent.

Figure 5:
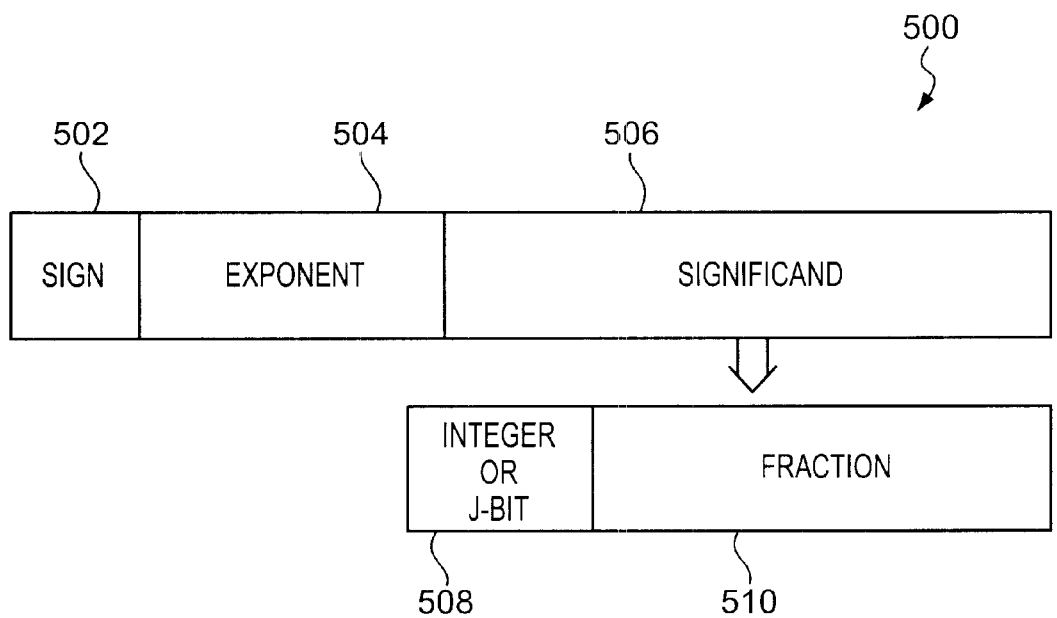
FIG. 5 is a binary floating-point format used by a 128-bit multimedia extension registers of one embodiment.

FIG. 5 is a binary floating-point format 500 used by the 128-bit multimedia extension registers of one embodiment. This format conforms to the IEEE standard. The sign 502 is a binary value that indicates the number is positive (0) or negative (1). The significand 506 has two parts: a 1-bit binary integer 508, also referred to as the J-bit; and, a binary fraction 510. In other embodiments, the J-bit 508 is not explicitly represented, but instead is an implied value. The exponent 504 is a binary integer that represents the base-2 power to which the significand 506 is raised.

Regarding memory data formats, the packed 128-bit data type comprises four single precision floating point numbers. The 128 bits are numbered 0 through 127, wherein bit 0 is the least significant bit (LSB), and bit 127 is the most significant bit (MSB). The bytes of the packed 128-bit data type of one embodiment have consecutive memory addresses, wherein the ordering is little endian, that is, the bytes with the lower addresses are less significant than the bytes with the higher addresses.

Regarding register data formats, values in the 128-bit multimedia extension registers have the same format as a 128-bit quantity in memory. Two data access modes are supported, a 128-bit access mode and a 32-bit access mode, but the invention is not so limited. The data type corresponds directly to the single-precision format in the IEEE standard. The fraction part of the significand is encoded. The integer is assumed to be one for all numbers except zero and denormalized finite numbers. The exponent of the single precision data type is encoded in biased format. The biasing constant is 127 for the single precision format.

When storing real values in memory, single-real values are stored in four consecutive bytes in memory. The 128-bit access mode is used for 128-bit memory accesses, 128-bit transfers between the 128-bit multimedia extension registers, and all logical, unpack and arithmetic instructions. The 32-bit access mode is used for 32-bit memory access, 32-bit transfers between the 128-bit multimedia extension registers, and all arithmetic instructions. The 64-bit access mode is used for 64-bit memory access, 64-bit transfers between the 128-bit multimedia extension registers, and all arithmetic instructions. Direct access is allowed to all of the 128-bit multimedia extension registers.

Figure 6:
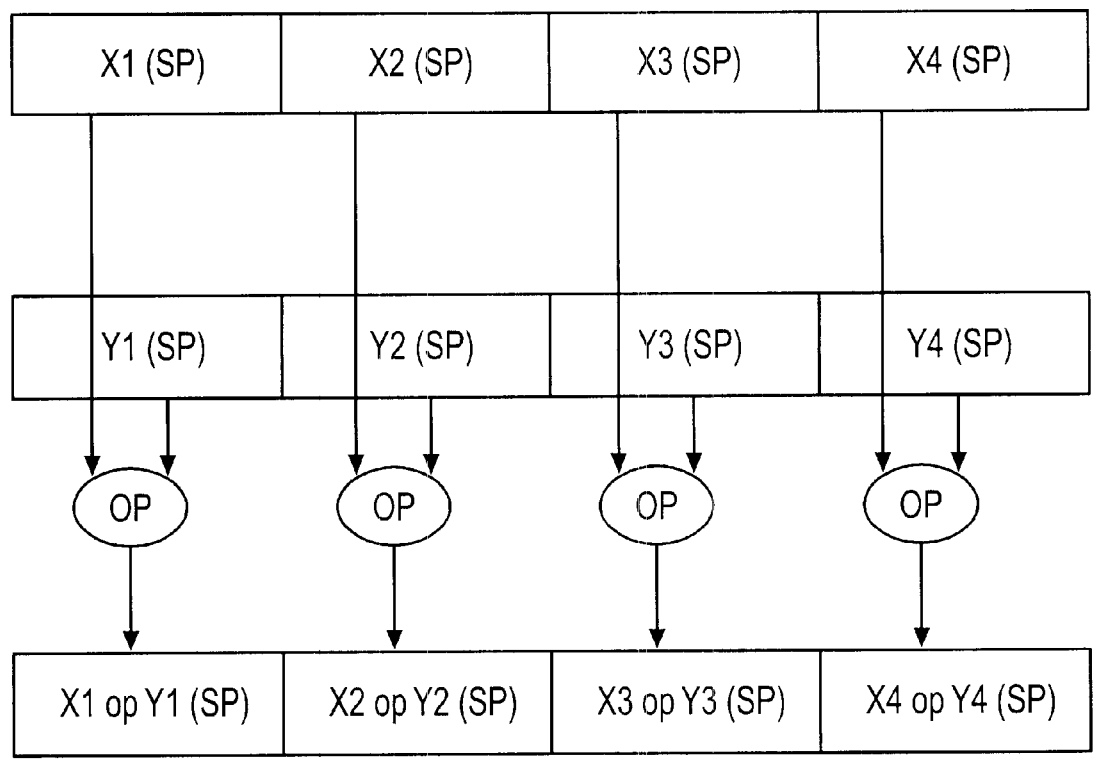
FIG. 6 shows a packed instruction operating on a pair of operands.
Figure 7:
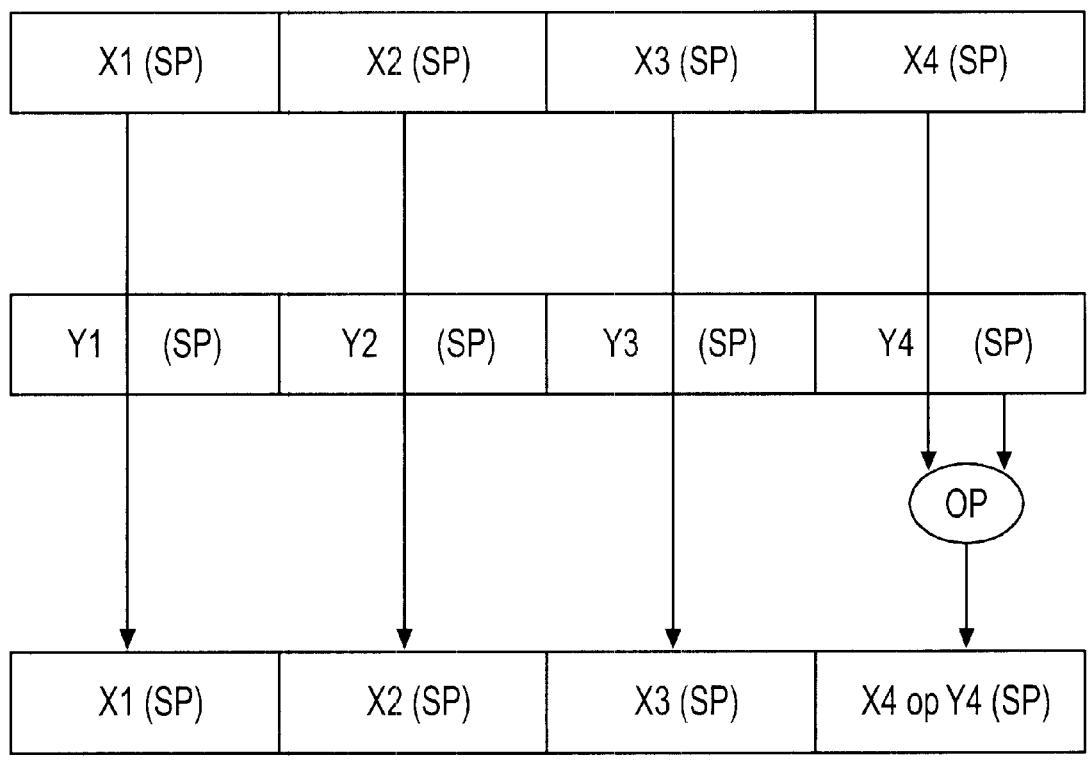
FIG. 7 shows a scalar instruction operating on a least significant pair of the two operands.

The instruction set of one embodiment used to operate on data operands of the 128-bit multimedia extension registers operates on either all or the least significant pairs of packed data operands, in parallel. FIG. 6 shows the packed instructions operating on a pair of operands. FIG. 7 shows the scalar instructions operating on the least significant pair of the two operands; for scalar operations, the three upper components from the first operand are passed through to the destination. Alternatively, the three upper components may be zeroed. In general, the address of a memory operand is aligned on a 16-byte boundary for all instruction, except for unaligned loads and stores.

Figure 8:
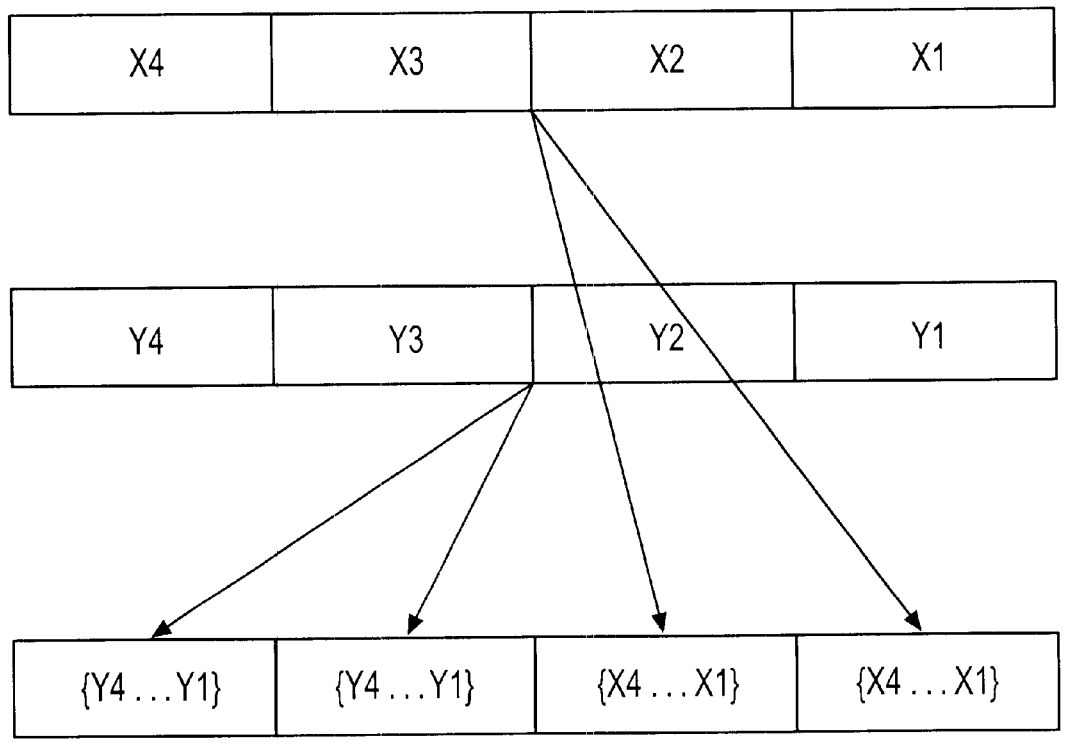
FIG. 8 shows a packed shuffle operation according to a SHUFPS instruction of one embodiment.

The instructions of one embodiment comprise a Shuffle Packed Single Precision Floating Point (SHUFPS) instruction. The SHUFPS instruction is capable of shuffling any of the packed four single precision floating point numbers from one source operand to the lower two destination fields; the upper two destination fields are generated from a shuffle of any of the four single precision floating point numbers from the second source operand. FIG. 8 shows the packed shuffle operation (the SHUFPS instruction) of one embodiment. By using the same register for both sources, the SHUFPS instruction can return any combination of the four single precision floating point numbers from this register.

In one embodiment, scalar integer or memory data may be converted in parallel using the instructions provided herein to a packed floating point format. The packed floating point data is manipulated to provide the graphic data used in 3D image rendering. Following manipulation, the packed floating point graphics data are converted in parallel using the instructions described herein to a packed integer format. The packed integer data are used to render an image display. As such, an application may use 128-bit multimedia extension register instructions in combination with 64-bit multimedia register instructions or 128-bit multimedia extension register instructions in combination with scalar register or memory instructions. Thus, the instructions of one embodiment comprise conversion instructions that support packed and scalar conversions between the 128-bit multimedia extension registers and either the 64-bit multimedia extension integer registers or the 32-bit integer IA™ registers.

Figure 9:
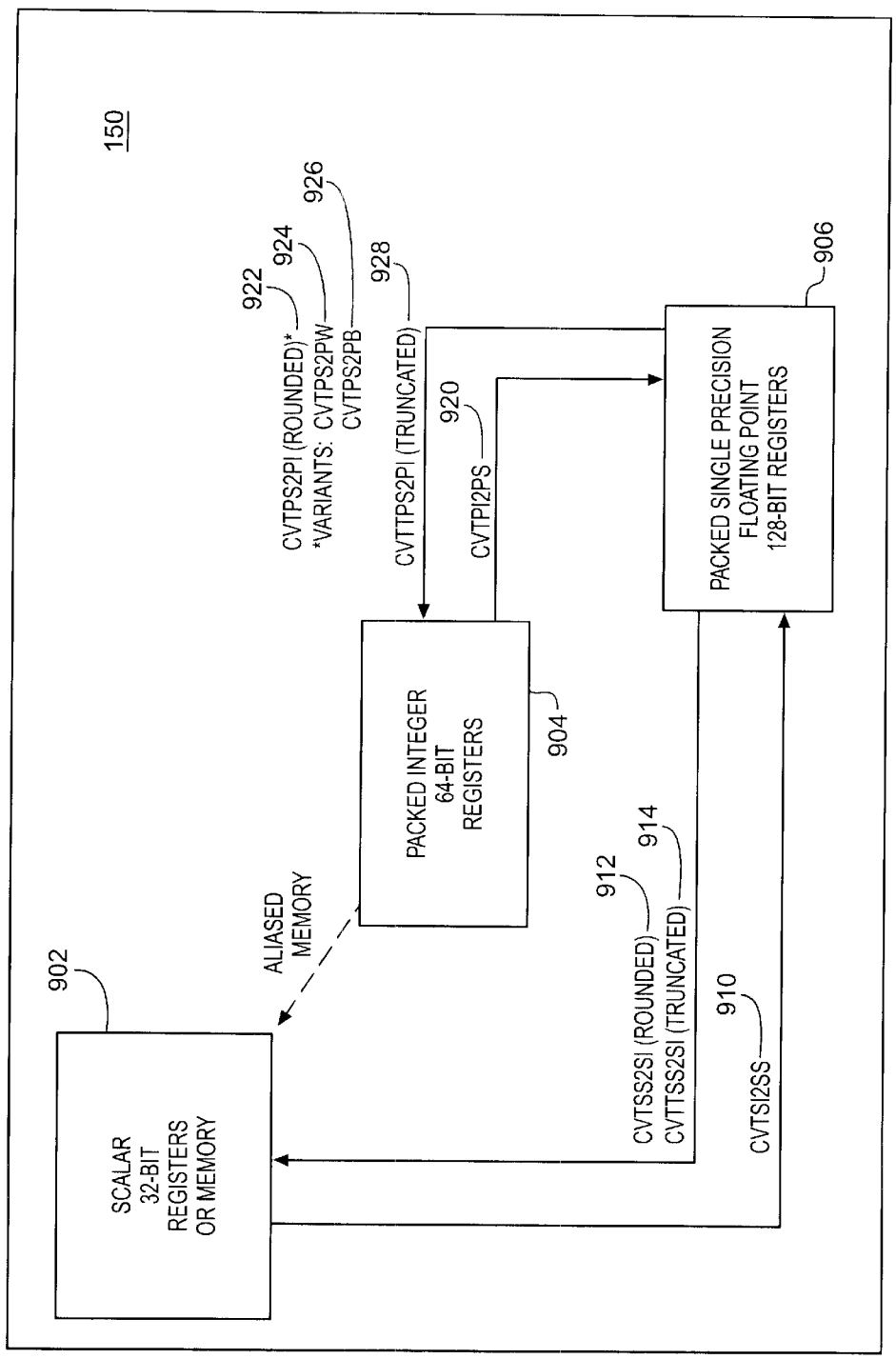
FIG. 9 shows a register file and corresponding conversion instructions of one embodiment.

FIG. 9 shows architectural registers supported by the register file 150 and the corresponding conversion instructions 910–928 of one embodiment. The register file supports a set of scalar 32-bit IA™ registers, a set of packed integer registers 904, or 64-bit multimedia extension registers, and a set of packed single precision floating point registers 906, or 128-bit multimedia extension registers, but the invention is not so limited. In one embodiment, as previously discussed herein, the packed integer registers 904 may be aliased onto the memory space of the scalar registers or the system memory 902, but the invention is not so limited.

The conversion instructions 910–928 corresponding to the registers 902–906 of the register file 150 provide an efficient means of converting between SIMD floating point data and SIMD integer data during data conversion between the registers. The conversion instructions comprise, but are not limited to, a Convert Scalar Integer to Scalar Single Precision Floating Point instruction (CVTSI2SS instruction) 910, a Convert Scalar Single Precision Floating Point to a 32-bit Integer instruction (CVTSS2SI instruction) 912, a Convert Truncate Scalar Single Precision Floating Point to Scalar 32-bit Integer instruction (CVTTSS2SI instruction) 914, a Convert Packed 32-bit Integer to Packed Single Precision Floating Point Instruction (CVTPI2PS instruction) 920, a Convert Packed Single Precision Floating Point to Packed 32-bit Integer instruction (CVTPS2PI instruction) 922, two variants of the CVTPS2PI instruction 922 comprising a CVTPS2PW instruction 924 and a CVTPS2PB instruction 926, and a Convert Truncate Packed Single Precision Floating Point to Packed 32-bit Integer instruction (CVTTPS2PI instruction) 928.

The Convert Scalar Integer to Scalar Single Precision Floating Point instruction (CVTSI2SS instruction) 910 of one embodiment converts a signed 32-bit integer from a 32-bit scalar, or integer, register 902 to a single precision floating point number. The single precision floating point number is placed in a register of a set of 128-bit multimedia extension registers 906. Alternatively, the CVTSI2SS instruction 910 converts a signed 32-bit integer from memory to a single precision floating point number, wherein the single precision floating point number is stored in a register of a set of 128-bit multimedia extension registers 906. When these conversions are inexact, rounding is performed according to the contents of a control and status register.

Figure 10:
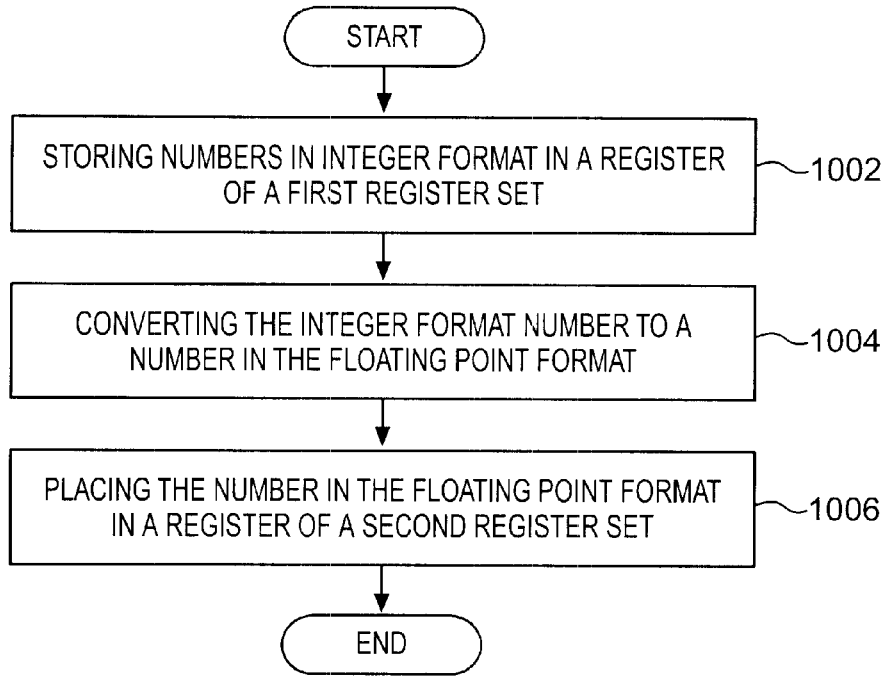
FIG. 10 is a flowchart for converting a number from a scalar format to a packed floating point format according to a CVTSI2SS instruction of one embodiment.

FIG. 10 is a flowchart for converting a number from a scalar format to a packed floating point format (the CVTSI2SS instruction) of one embodiment. Operation begins at step 1002, at which a number is stored in the integer format in a register of a first set of architectural registers in a scalar format. The integer format of one embodiment is a 32-bit integer format, but the invention is not so limited. The first set of architectural registers may comprise eight 32-bit registers, but the invention is not so limited. The number in the integer format is converted, at step 1004, to a number in the floating point format. The floating point format of one embodiment is a 32-bit single precision floating point format, but the invention is not so limited. In one embodiment, the step of converting comprises accessing rounding control bits in a control and status register, and rounding the number in the floating point format according to the rounding control bits. The number in the floating point format is placed in a register of a second set of architectural registers in a packed format, at step 1006. In one embodiment, the second set of architectural registers comprises eight 128-bit registers, but the invention is not so limited. The step of placing the number in the floating point format in a register of a second set of architectural registers may comprise placing the number in the floating point format in a lowest segment of the register and preserving upper segments of the register unchanged, but the invention is not so limited.

The Convert Scalar Single Precision Floating Point to a 32-bit Integer instruction (CVTSS2SI instruction) 912 converts the least significant single precision floating point number from a 128-bit multimedia extension register 906 to a 32-bit signed integer. The 32-bit signed integer is placed in an IA™ scalar 32-bit integer register 902. When the conversion is inexact, rounding is performed according to the contents of a control and status register.

The Convert Truncate Scalar Single Precision Floating Point to Scalar 32-bit Integer instruction (CVTTSS2SI instruction) 914 converts the least significant single precision floating point number from a 128-bit multimedia extension register 906 to a 32-bit signed integer. The 32-bit signed integer is placed in an IA™ scalar 32-bit integer register 902. When the conversion is inexact, the result is truncated implicitly without the step of accessing a rounding mode from a control and status register.

Figure 11:
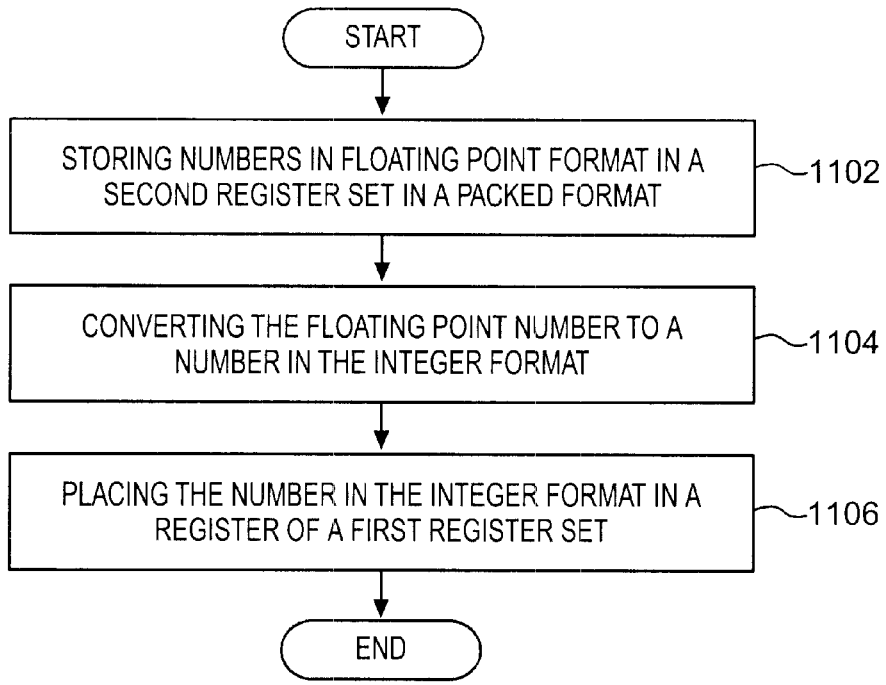
FIG. 11 is a flowchart for converting a number from a packed floating point format to a scalar format according to CVTSS2SI and CVTTSS2SI instructions of one embodiment.

FIG. 11 is a flowchart for converting a number from a packed floating point format to a scalar format (the CVTSS2SI and CVTTSS2SI instructions) of one embodiment. Operation begins at step 1102, at which a plurality of numbers are stored in the floating point format in a register of the second set of architectural registers in a packed format. In one embodiment, four numbers are stored in the floating point format, but the invention is not so limited. The floating point format of one embodiment is a 32-bit single precision floating point format, but the invention is not so limited. In one embodiment, the second set of architectural registers comprises eight 128-bit registers, but the invention is not so limited. One of the plurality of numbers in the floating point format is converted, at step 1104, to a number in the integer format. The integer format of one embodiment is a 32-bit integer format, but the invention is not so limited. In one embodiment of the CVTSS2SI instruction, the step of converting comprises accessing rounding mode bits from a control and status register, and rounding the number in the integer format according to the rounding mode indicated.

In one embodiment of the CVTTSS2SI instruction, the step of converting comprises truncating the number in the integer format implicitly according to mode bits in a conversion instruction. The truncate operation is thus implied by the conversion instruction, and the processing time required to access the control and status register to determine a rounding mode is eliminated. Typical applications perform floating point computations using the round-to-nearest rounding mode, the truncate rounding mode is generally employed when converting from floating point to integer. Changing the rounding mode typically requires changing the rounding control in a control status register. Encoding the truncate rounding mode in the instruction avoids updating the status register because the rounding mode specified by the instruction overrides the status register setting.

The number in the integer format is placed in a register of the first set of architectural registers in a scalar format, at step 1106. The first set of architectural registers may comprise eight 32-bit registers, but the invention is not so limited.

The Convert Packed 32-bit Integer to Packed Single Precision Floating Point Instruction (CVTPI2PS instruction) 920 converts two 32-bit signed integers from a 64-bit multimedia extension packed integer register 904 to two least significant single precision floating point numbers. The single precision floating point numbers are placed in a 128-bit multimedia extension register 906. When the conversion is inexact, rounding is performed according to a control and status register from memory. The upper two significant numbers in the destination register are zeroed.

Figure 12:
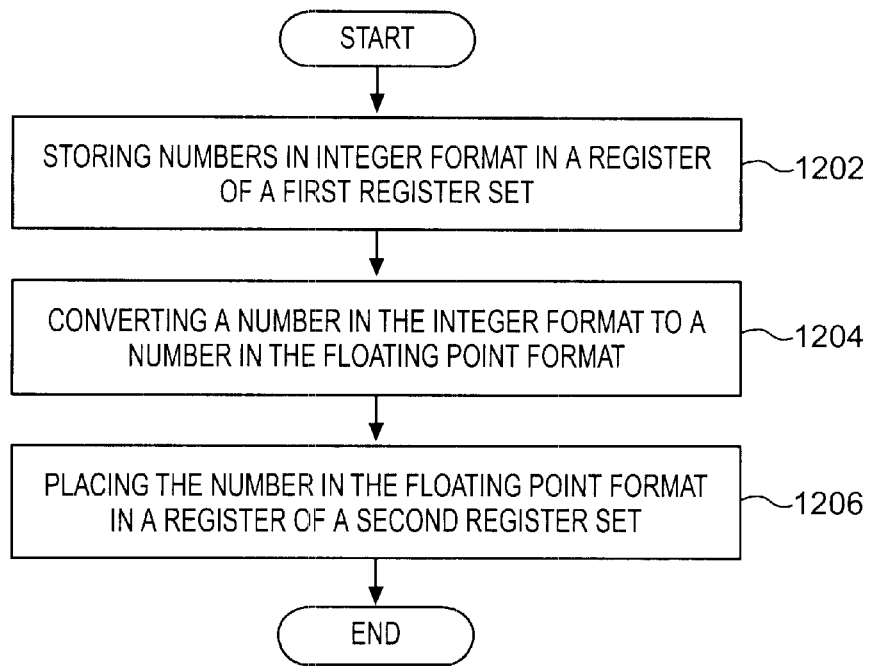
FIG. 12 is a flowchart for converting a number from a packed integer format to a packed floating point format according to a CVTPI2PS instruction of one embodiment.

FIG. 12 is a flowchart for converting a number from a packed integer format to a packed floating point format (the CVTPI2PS instruction) of one embodiment. Operation begins at step 1202, at which a first plurality of numbers in the integer format are stored in a register of a first set of architectural registers in a packed format. In one embodiment, two numbers are stored in the integer format, but the invention is not so limited. The integer format of one embodiment is a 32-bit integer format, but the invention is not so limited. The first set of architectural registers may comprise eight 64-bit registers, but the invention is not so limited. At least one number in the integer format is converted, at step 1204, to at least one number in the floating point format. The floating point format of one embodiment is a 32-bit single precision floating point format, but the invention is not so limited. In one embodiment, the step of converting comprises accessing rounding control bits in a control and status register, and rounding the number in the floating point format according to the rounding control bits. At least one number in the floating point format is placed in a register of a second set of architectural registers in a packed format, at step 1206. The at least one number in the floating point format may comprise two numbers, but the invention is not so limited. In one embodiment, the second set of architectural registers comprises eight 128-bit registers, but the invention is not so limited. The step of placing at least one number in the floating point format in a register of a second set of architectural registers may comprise placing two numbers in the floating point format in a lower half of the register and preserving an upper half of the register unchanged, but the invention is not so limited.

In one embodiment, there are several variants 922–926 of an instruction that converts packed single precision floating point values in a 128-bit multimedia extension register 906 to packed 32-bit integers stored in a 64-bit multimedia extension register 904. The first variant is the Convert Packed Single Precision Floating Point to Packed 32-bit Integer instruction (CVTPS2PI instruction) 922 that converts the two least significant single precision floating point numbers from a 128-bit multimedia extension register 906 to two 32-bit signed integers. The two 32-bit signed integers are placed in a 64-bit multimedia extension register 904. When the conversion is inexact, rounding is performed according to the contents of a control and status register.

The second variant is the CVTPS2PW instruction 924 that converts four single precision floating point numbers in a 128-bit multimedia extension register 906 to four 16-bit integers stored in a 64-bit multimedia extension register 904. The third variant is the CVTPS2PB instruction 926 that converts four single precision floating point numbers in a 128-bit multimedia extension register 906 to four 8-bit integers stored in the lower 32-bit field of a 64-bit multimedia extension register 904. Other possible variants include integer, byte, and word versions of conversion instructions that operate on data in integers, bytes and words, respectively.

The Convert Truncate Packed Single Precision Floating Point to Packed 32-bit Integer instruction (CVTTPS2PI instruction) 928 converts the two least significant single precision floating point numbers from a 128-bit multimedia extension register 906 to two 32-bit signed integers. The two 32-bit signed integers are placed in a 64-bit multimedia extension register 904. When the conversion is inexact, the result is truncated implicitly without the step of accessing a rounding mode from a control and status register.

Figure 13:
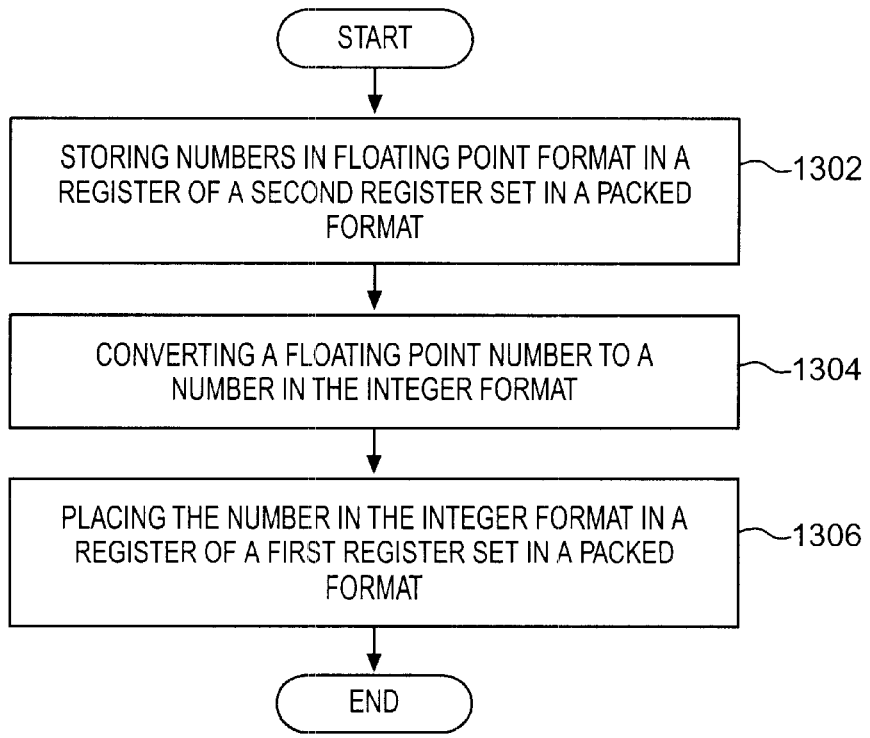
FIG. 13 is a flowchart for converting a number from a packed floating point format to a packed integer format according to CVTPS2PI and CVTTPS2PI instructions of one embodiment.

FIG. 13 is a flowchart for converting a number from a packed floating point format to a packed integer format (the CVTPS2PI and CVTTPS2PI instructions) of one embodiment. Operation begins at step 1302, at which a second plurality of numbers are stored in the floating point format in a register of the second set of architectural registers in a packed format. In one embodiment, four numbers are stored in the floating point format, but the invention is not so limited. The floating point format of one embodiment is a 32-bit single precision floating point format, but the invention is not so limited. In one embodiment, the second set of architectural registers comprises eight 128-bit registers, but the invention is not so limited. At least one of the plurality of numbers in the floating point format is converted, at step 1304, to at least one number in the integer format. The integer format of one embodiment is a 32-bit integer format, but the invention is not so limited. In one embodiment of the CVTPS2PI instruction, the step of converting comprises accessing rounding mode bits from a control and status register, and rounding the number in the integer format according to a rounding mode indicated by the rounding mode bits. In one embodiment of the CVTTPS2PI instruction, the step of converting comprises implicitly truncating the number in the integer format according to a truncate mode indicated by the conversion instruction. The number in the integer format is placed in a register of the first set of architectural registers in a packed format, at step 1306. The first set of architectural registers may comprise eight 64-bit registers, but the invention is not so limited.

The CVTTPS2PI instruction of one embodiment encodes the rounding mode in the instruction, which improves performance as described above with respect to the CVTTSS2SI instruction.

Figure 14:
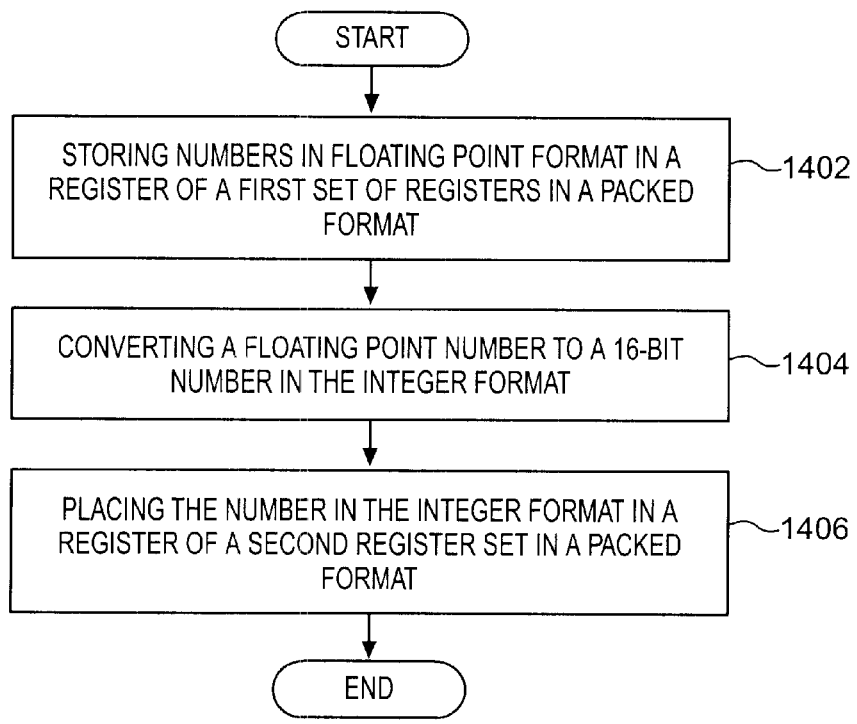
FIG. 14 is a flowchart for a second variant instruction used for converting a number from a packed floating point format to a packed integer format according to a CVTPS2PW instruction of one embodiment.

FIG. 14 is a flowchart for a second variant instruction used for converting a number from a packed floating point format to a packed integer format (the CVTPS2PW instruction). Operation begins at step 1402, at which a plurality of numbers are stored in the floating point format in a register of a first set of architectural registers in a packed format. In one embodiment, four numbers are stored in the floating point format, but the invention is not so limited. The floating point format of one embodiment is a 32-bit single precision floating point format, but the invention is not so limited. In one embodiment, the first set of architectural registers comprises eight 128-bit registers, but the invention is not so limited. At least one of the plurality of numbers in the floating point format is converted, at step 1404, to at least one number in the integer format. The integer format of one embodiment is a 16-bit integer format, but the invention is not so limited. The step of converting of one embodiment comprises accessing rounding mode bits from a control and status register, and rounding the number in the integer format according to a rounding mode indicated by the rounding mode bits. The numbers in the 16-bit integer format are placed in a register of a second set of architectural registers in a packed format, at step 1406. The second set of architectural registers may comprise eight 64-bit registers, but the invention is not so limited. Following the conversion, each 64-bit register may comprise four 16-bit integers representing the contents of one 128-bit floating point register, but the invention is not so limited.

Figure 15:
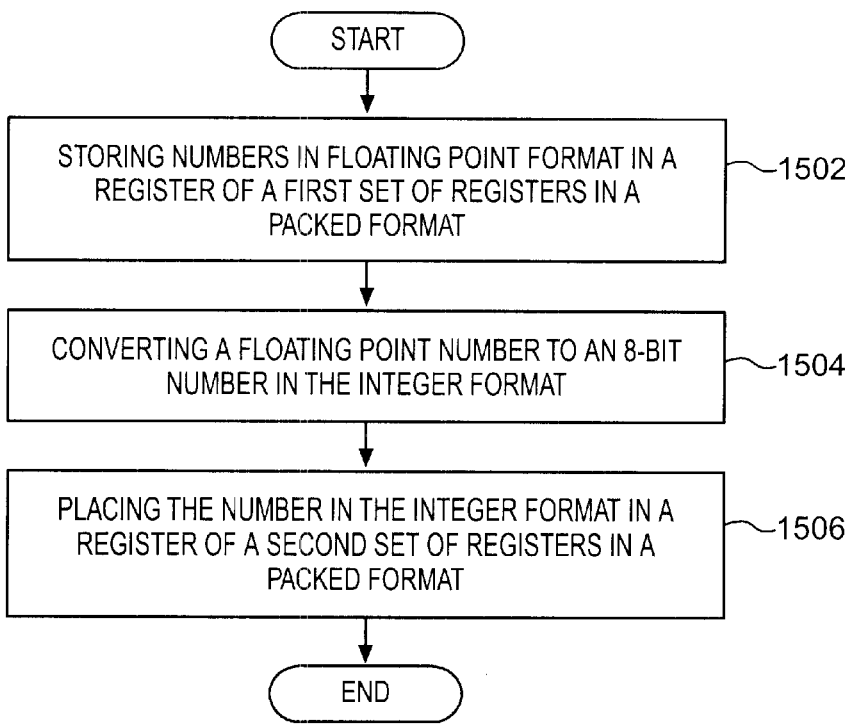
FIG. 15 is a flowchart for a third variant used for converting a number from a packed floating point format to a packed integer format according to a CVTPS2PB instruction of one embodiment.

FIG. 15 is a flowchart for a third variant used for converting a number from a packed floating point format to a packed integer format (the CVTPS2PB instruction). Operation begins at step 1502, at which a plurality of numbers are stored in the floating point format in a register of a first set of architectural registers in a packed format. In one embodiment, four numbers are stored in the floating point format, but the invention is not so limited. The floating point format of one embodiment is a 32-bit single precision floating point format, but the invention is not so limited. In one embodiment, the first set of architectural registers comprises eight 128-bit registers, but the invention is not so limited. At least one of the plurality of numbers in the floating point format is converted, at step 1504, to at least one number in the integer format. The integer format of one embodiment is an 8-bit integer format, but the invention is not so limited. The step of converting of one embodiment comprises accessing rounding mode bits from a control and status register, and rounding the number in the integer format according to a rounding mode indicated by the rounding mode bits. The numbers in the 8-bit integer format are placed in a register of a second set of architectural registers in a packed format, at step 1506. The second set of architectural registers may comprise eight 64-bit registers, but the invention is not so limited. Following the conversion, each 64-bit register may comprise four 8-bit integers representing the contents of one 128-bit floating point register, but the invention is not so limited.

The conversion instructions retain SIMD parallelism even though the widths of the registers are different. For conversions from the 128-bit to the 64-bit multimedia extension registers, the lower two SIMD floating point elements are converted to 32-bit integer elements per conversion instruction; therefore, two instantiations of a particular instruction are used to convert all four single precision elements, wherein shuffling of the operands is performed prior to issuance of the second conversion instruction. For conversions from the 64-bit to the 128-bit multimedia extension registers, the two 32-bit integer values are converted to single precision floating point and placed in the lower two elements of the floating point 128-bit multimedia extension register; the upper two elements of the floating point 128-bit multimedia extension register remain unchanged. This approach of passing the upper elements through intact provides greater flexibility in the merging of new data with existing data.

Multimedia graphics are typically generated by treating an image as a collection of small, independently controlled dots, or pixels, arranged on a screen or cathode ray tube. A computer graphic image is typically composed of a number of objects rendered onto a background image. During rendering, the object may be combined with previously generated objects using compositing techniques, wherein compositing is the combining of multiple images by overlaying or blending the images. In a composited image, the value of each pixel is computed from the component images. In rendering multimedia 3D graphics, images are composited in two phases—geometry and rasterization. The geometry phase comprises building images for compositing using triangles formed by vertices defined in 3D coordinate space. Rasterization is the conversion of vector graphics, or images described in terms of mathematical elements such as points and lines, to equivalent images composed of pixel patterns that can be stored and manipulated as sets of bits.

In composing the triangles that form the images, each vertex or coordinate has a corresponding color value from a particular color model. A color model is a specification of a 3D color coordinate system and a visible subset in the coordinate system within which all colors in a particular color gamut lie, wherein a color gamut is a subset of all visible chromaticities. For example, the red (R), green (G), blue (B), color model (RGB) is the unit cube subset of the 3D Cartesian coordinate system. The purpose of a color model is to allow convenient specification of colors within some color gamut. The RGB primaries are additive primaries in that the individual contributions of each primary are added together to yield the resultant pixel.

The value of each pixel in a composited multimedia image is computed from the component images in some fashion. In an overlay, the pixels of the foreground image are given transparency values in addition to the RGB values. The value of a pixel in the composited image is taken from the background image unless the foreground image has a nontransparent value at that point, in which case the value is taken from the foreground image. Therefore, as an image is produced, coverage information is recorded so that the color associated with each pixel in the image is given an alpha value (A) representing the coverage of the pixel. Consequently, for an image that is to become the foreground element of a composited image, many of the pixels are registered as having coverage zero as they are transparent; the remainder, which constitute the important content of the foreground image, have larger coverage values, typically one. Thus, to do compositing in a reasonable fashion, the alpha information is provided at each pixel of the images being composited, so that along with the RGB values of an image there is an alpha value (A) encoding the coverage of each pixel.

In multimedia algorithms, data parallelism can be exploited in many different ways. One possible way is by executing the same operations on all elements of a color plane. This method involves organizing the information for an image in memory by storing the image by color plane. Consequently, all of the R components are at successive addresses in memory, all of the G components are also at successive addresses, and so on for the B and alpha components. All of the components of each color plane of an image must have the same operation performed on them. With all of the red color components being at successive addresses, it is easy to grab four elements of the R plane in a single memory access, and similarly to grab the corresponding four elements of the alpha plane in a single memory access. Executing the operation by color plane and using multimedia extension technology to compute in parallel on four elements of a given color plane allows for the exploitation of data parallelism.

A second method for exploiting data parallelism is by executing the same operations on all color elements of a pixel. This method involves organizing the information for an image in memory by storing the information about each image so that the three color components, R, G, and B, and the alpha component, of each pixel are at successive addresses in memory. In using the multimedia extension technology, one memory access takes the RGBA components for one pixel and executes in parallel operations on all the representative components of the pixel.

A further example of the exploitation of data parallelism in multimedia applications involves manipulating coordinates of points in space. Using this technique, data parallelism is exploited by executing the same operations on a given coordinate or by executing the same operations on all points of the space.

Figure 16:
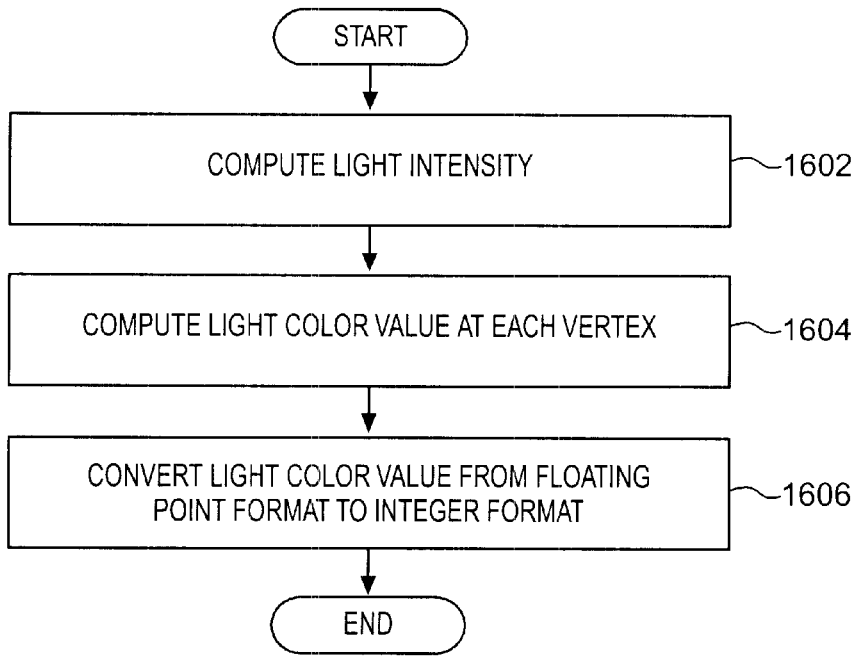
FIG. 16 is a flowchart for a lighting computation in 3D geometry in which the instructions of one embodiment are used.

The instructions disclosed herein allow for the parallel conversion of multiple single precision floating point color values to a specific integer format. One application described herein, but to which the invention is not so limited, uses the conversion instructions for the parallel conversion of lighting function data in 3D graphics. FIG. 16 is a flowchart for the lighting computation in 3D geometry in which the instructions of one embodiment are used. Operation begins at step 1602, at which a light intensity is computed. A light color value is computed, at step 1604, for each vertex. The light color value is converted from a floating point format to an integer format, at step 1606, wherein floating point color values for red (R), green (G), and blue (B) color components are converted into integer values.

Figure 17:
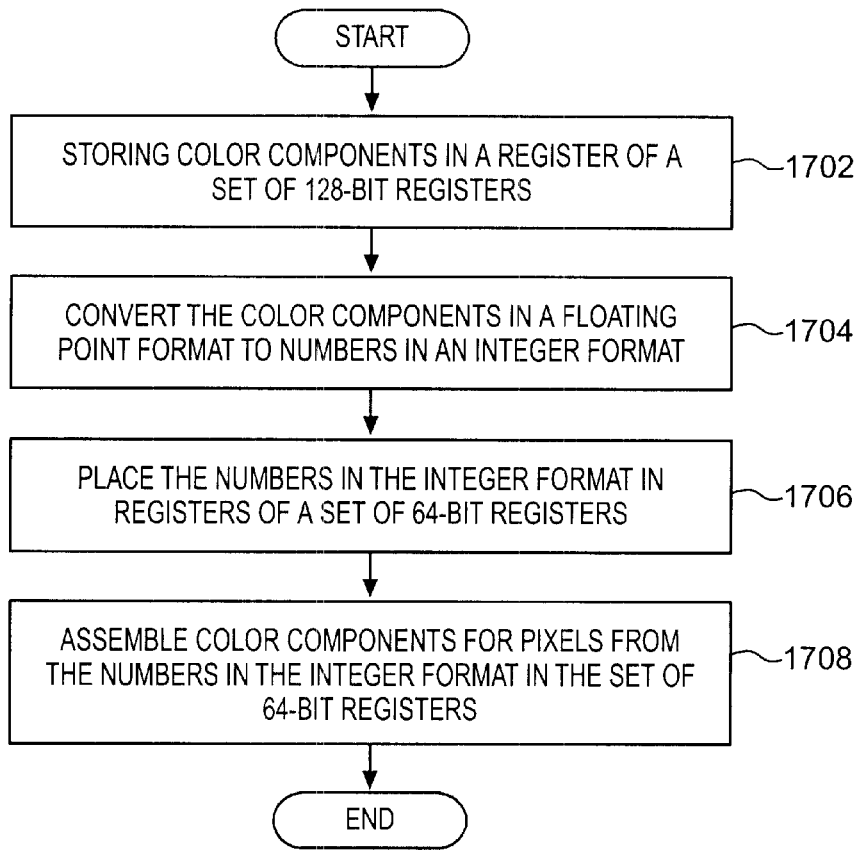
FIG. 17 is a flowchart for a parallel conversion of multiple color values from a single precision floating point format to a specific integer format of one embodiment.

FIG. 17 is a flowchart for the parallel conversion of multiple color values from a single precision floating point format to a specific integer format of one embodiment. Operation begins at step 1702, at which a number of color components in a floating point format are stored in a register of a set of 128-bit registers. The floating point data is stored in the 128-bit registers in the packed format. Each of the color components in the floating point format are converted to color values, or numbers, in an integer format, at step 1704. The numbers in the integer format are placed in at least one register of a set of 64-bit registers, at step 1706. The integer data is stored in the 64-bit registers in the packed format. The color components are assembled for each pixel of a composited graphic using the numbers in the integer format from the set of 64-bit registers. In one embodiment, the color components in each of the registers of the set of 128-bit registers represent values in the same color plane. In an alternate embodiment, the color components in each of the registers of the set of 128-bit registers represent color components that define a color of a pixel.

Figure 18A:
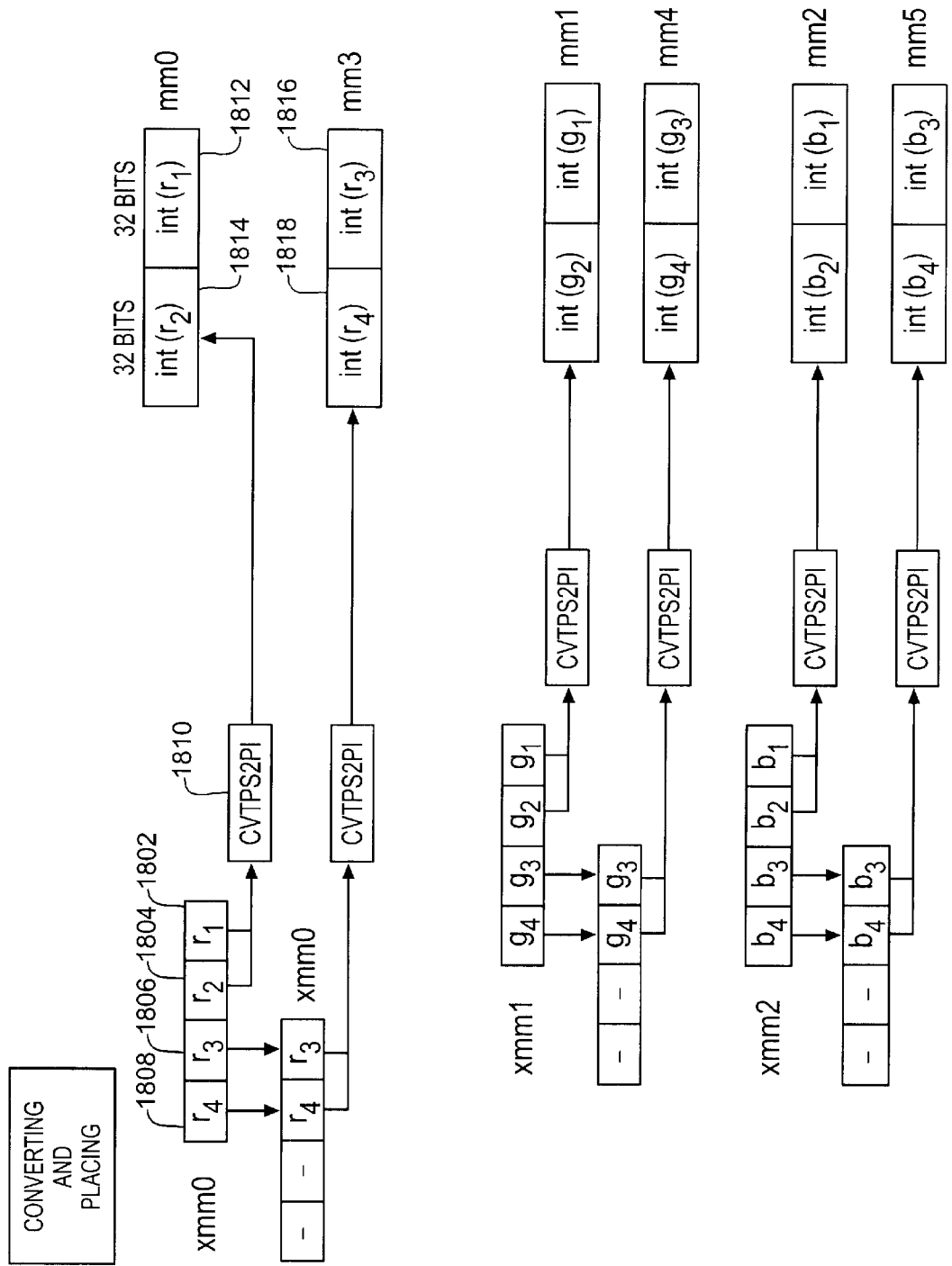
FIG. 18 is a data flow diagram of a parallel conversion of graphic color data using a CVTPS2PI instruction of one embodiment.
Figure 18B:
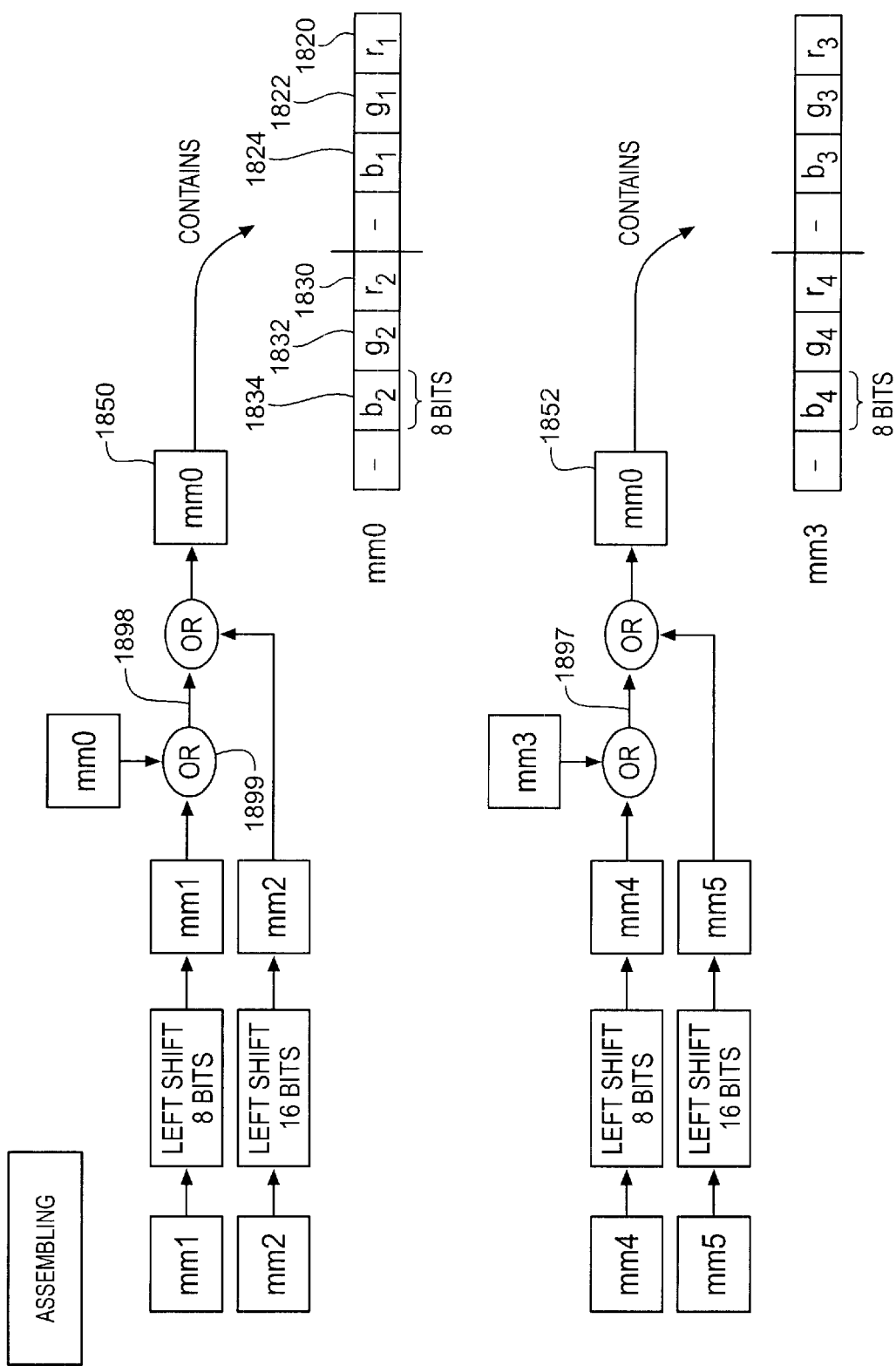

In one embodiment, the CVTPS2PI instruction previously discussed herein is used to convert the color components in the floating point format to color values in an integer format, at step 1704. FIG. 18 is a data flow diagram of the parallel conversion of graphic color data using the CVTPS2PI instruction of one embodiment. In this embodiment, it is necessary to clamp the value of floating point operands used in conversion of graphic color data to 8-bit values. This is necessary because some of the data manipulations would create meaningless values if the floating point data was greater than 8 bits wide.

Using the CVTPS2PI instruction, the step of converting, step 1704, comprises converting 1810 first and second 32-bit color values located in the lower 64 bits 1802–1804 of a 128-bit register XMM0 to first and second 32-bit numbers in the integer format. Following this step, the third and fourth 32-bit color values 1806–1808 located in the upper 64 bits of the 128-bit register XMM0 are shifted into the lower 64-bits of the 128-bit register 1802–1804. The third and fourth 32-bit color values are converted to third and fourth 32-bit numbers in the integer format. In one embodiment, the aforementioned steps are performed for each of three 128-bit registers XMM0–XMM2, wherein one 128-bit register XMM0 comprises data for a Red color component of each of four pixels, one 128-bit register XMM1 comprises data for a Green color component of each of four pixels, and one 128-bit register XMM2 comprises data for a Blue color component of each of four pixels, but the invention is not so limited. In an alternate embodiment, a fourth 128-bit register (not shown) may comprise transparency data for each of four pixels.

In one embodiment, the step of placing, step 1706, comprises placing the first and second 32-bit numbers 1812–1814 in the integer format from a first 128-bit register XMM0 in a first 64-bit register MM0, and placing the third and fourth 32-bit numbers 1816–1818 in the integer format from the first 128-bit register XMM0 in a second 64-bit register MM3. The first and second 32-bit numbers in the integer format from a second 128-bit register XMM1 are placed in a third 64-bit register MM1, and the third and fourth 32-bit numbers in the integer format from the second 128-bit register XMM1 are placed in a fourth 64-bit register MM4. The first and second 32-bit numbers in the integer format from a third 128-bit register XMM2 are placed in a fifth 64-bit register MM2, and the third and fourth 32-bit numbers in the integer format from the third 128-bit register XMM2 are placed in a sixth 64-bit register MM5. In an alternate embodiment, the first and second 32-bit numbers in the integer format from a fourth 128-bit register (not shown) are placed in a seventh 64-bit register (not shown), and the third and fourth 32-bit numbers in the integer format from the fourth 128-bit register are placed in an eighth 64-bit register (not shown).

The step of assembling, step 1708, generally comprises manipulating the contents of the set of six 64-bit registers MM0–MM5, wherein the manipulation results in each 64-bit register comprising the color components that define a pixel. Specifically, in one embodiment, following the step of placing, step 1706, each register of the set of six 64-bit registers MM0–MM5 comprises data for one color component of each of two pixels. Therefore, the step of assembling, step 1708, comprises a logical combination of the first three registers MM0–MM2 of the set of six 64-bit registers, wherein the combination results in a first combined 64-bit register 1850 comprising three 8-bit color components for each of a first 1820–1824 and a second 1830–1834 pixel, wherein the three 8-bit color components define the color of a pixel. The contents of the first combined register 1850 are placed into register MM0.

The logical combination of one embodiment comprises performing a bitwise logical OR 1899 of the contents of the first MM0 and the second MM1 64-bit registers, but the invention is not so limited. The bitwise logical OR instruction performs a bitwise logical OR on 64 bits of the destination and source operands and writes the result to the destination register. Each bit of the result is set to 0 if the corresponding bits of both operands are 0; otherwise, the bit is 1. A bitwise logical OR is then performed of the result of the first logical operation 1898 and the contents of the third 64-bit register MM2. The result of these two logical operations is a first combined 64-bit register 1850 comprising three 8-bit color components for each of a first 1820–1824 and second 1830–1834 pixel.

Moreover, a logical combination is performed of the second three registers MM3–MM5 of the set of six 64-bit registers MM0–MM5, wherein the combination results in a second combined 64-bit register 1852 comprising three 8-bit color components for each of a third and a fourth pixel. The logical combination of the second three registers MM3–MM5 of one embodiment comprises performing a bitwise logical OR of the contents of the fourth MM3 and the fifth MM4 64-bit registers, but the invention is not so limited. A bitwise logical OR is then performed of the result of this third logical operation 1897 and the contents of the sixth 64-bit register MM5. The result of these two logical operations is a second combined 64-bit register 1852 comprising three 8-bit color components for each of a third and fourth pixel. The contents of the second combined register 1852 are placed into register MM3. In an alternate embodiment, transparency data may be manipulated along with the R, G, B data of a pixels, wherein the two remaining 8-bit slots of the combined 64-bit registers will comprise transparency data for the corresponding pixel.

Figure 19A:
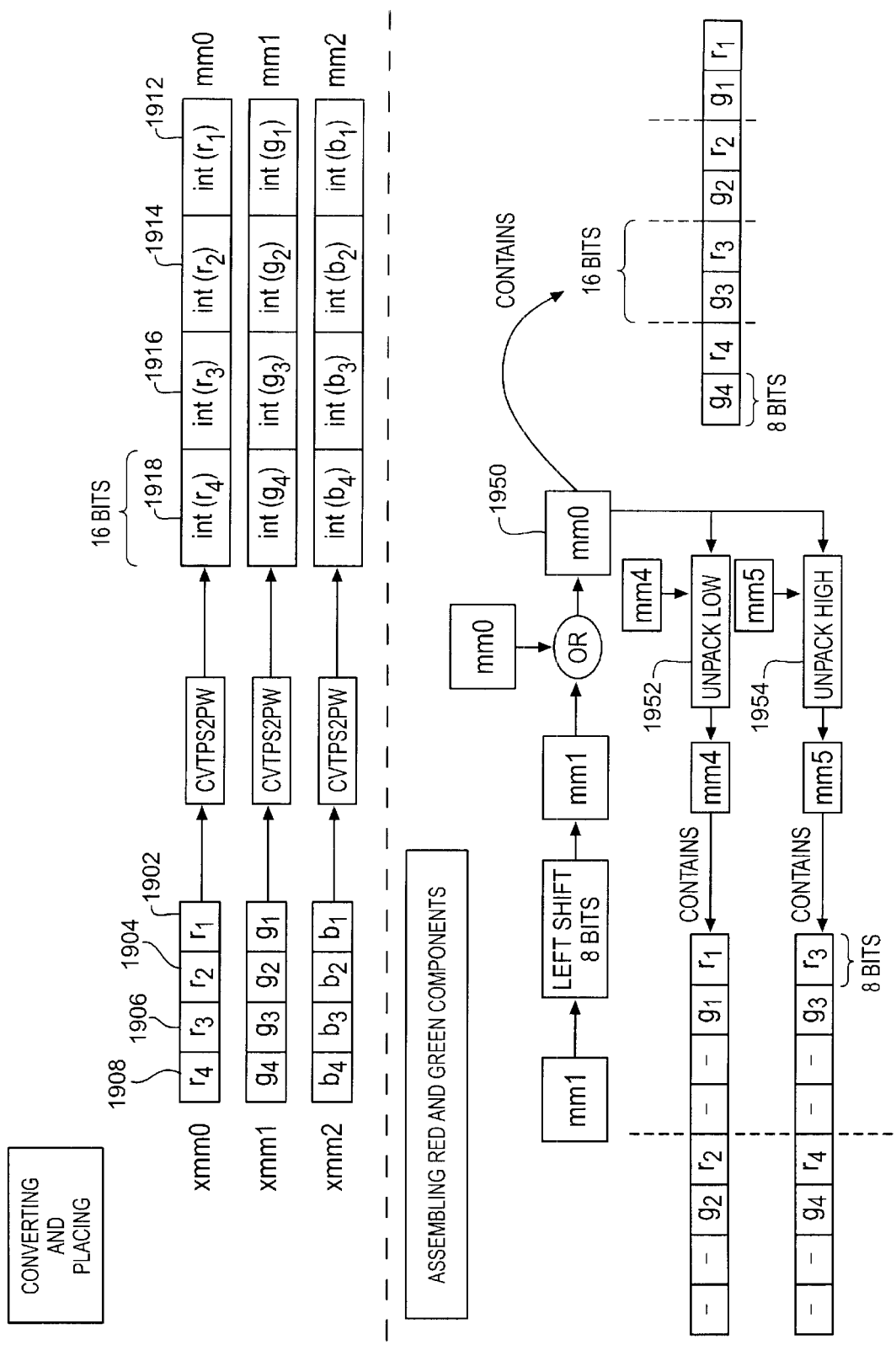
FIG. 19 is a data flow diagram of a parallel conversion of graphic color data using. a CVTPS2PW instruction of one embodiment.
Figure 19B:
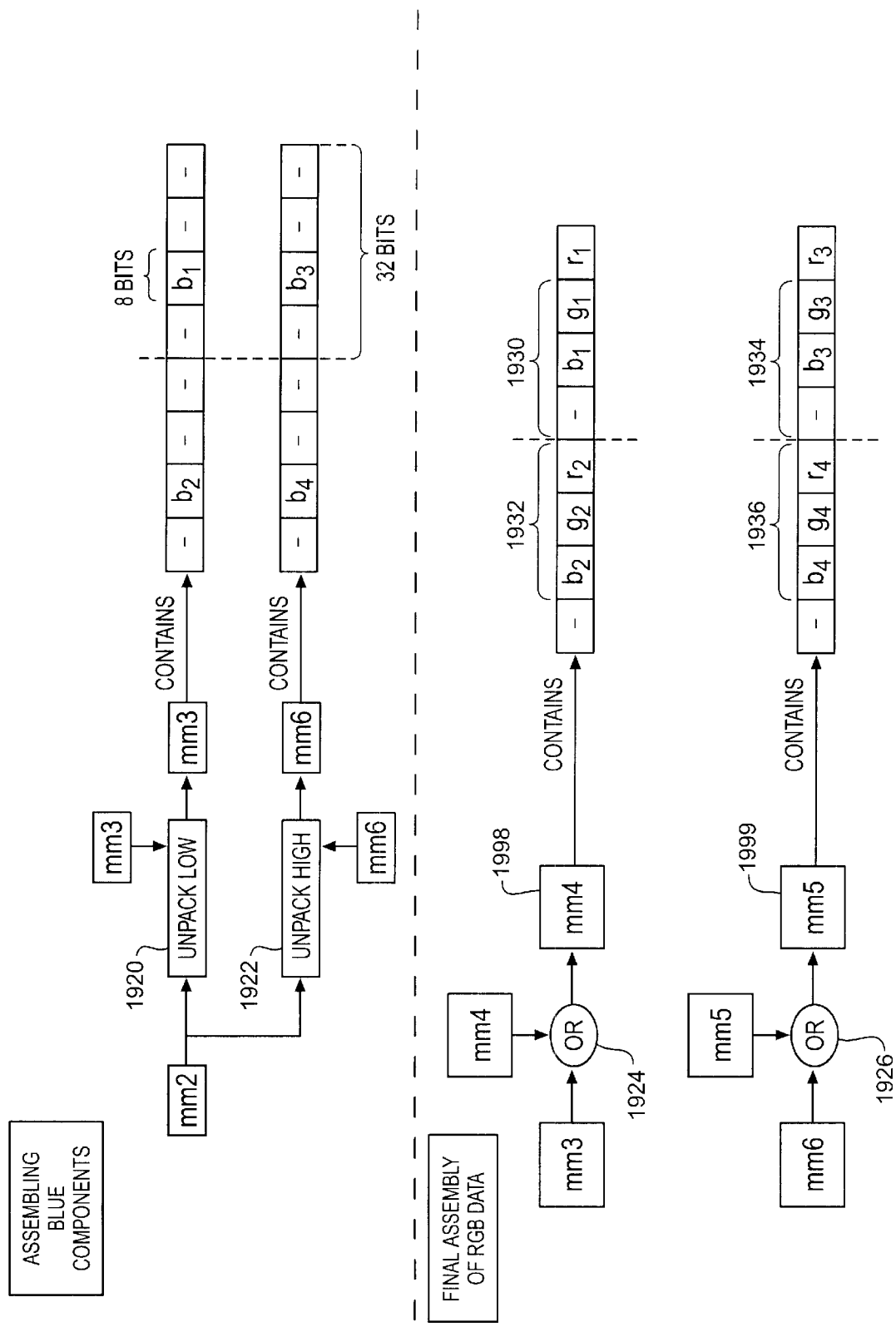

In one embodiment, the CVTPS2PW instruction previously discussed herein is used to convert the color components in the floating point format to color values in an integer format, at step 1704. FIG. 19 is a data flow diagram of the parallel conversion of graphic color data using the CVTPS2PW instruction of one embodiment. In this embodiment, it is necessary to clamp the value of floating point operands used in conversion of graphic color data to 8-bit values. This is necessary because some of the data manipulations would create meaningless values if the floating point data was greater than 8 bits wide.

Using this instruction, the step of converting, step 1704, comprises converting four 32-bit color components 1902–1908 located in a 128-bit register XMM0 to four 16-bit numbers 1912–1918, or color components, in a 64-bit register MM0. In one embodiment, the aforementioned steps are performed for each of three 128-bit registers XMM0–XMM2, wherein one 128-bit register XMM0 comprises data for a Red color component of each of four pixels, one 128-bit register XMM1 comprises data for a Green color component of each of four pixels, and one 128-bit register XMM2 comprises data for a Blue color component of each of four pixels, but the invention is not so limited. In an alternate embodiment, a fourth 128-bit register (not shown) may comprise transparency data for each of four pixels. In another alternate embodiment, each register of a set of three 128-bit registers may comprise data for the color components of a pixel, and each register of the set of three 64-bit registers may comprise data for the color components that define a pixel.

The step of placing, step 1706, comprises placing the four 16-bit numbers, or color components, in the integer format in a 64-bit register. Therefore, in one embodiment, a first 64-bit register MM0 corresponding to a first 128-bit register XMM0 comprises the Red component data for each of four pixels, a second 64-bit register MM1 corresponding to a second 128-bit register XMM1 comprises the Green component data for each of the four pixels, and a third 64-bit register MM2 corresponding to a third 128-bit register XMM2 comprises the Blue component data for each of the four pixels, but the invention is not so limited.

The step of assembling, step 1708, generally comprises manipulating the contents of the set of three 64-bit registers MM0–MM2, wherein the manipulation results in two 64-bit registers 1998–1999 that each comprise the color components that define each of two pixels. In one embodiment, the manipulation comprises the logical combination of two registers MM0–MM1 of the set of three 64-bit registers MM0–MM2, wherein the combination results in a first MM4 and a second MM5 combined 64-bit register. The first combined register MM4 comprises a first and a second 8-bit color component for each of a first and a second pixel, and the second combined register MM5 comprises a first and a second 8-bit color component for each of a third and a fourth pixel. A third combined 64-bit register MM3 is generated by performing an unpack operation 1920 on the lower 32 bits of the third 64-bit register MM2, wherein the third combined register MM3 comprises a third 8-bit color component for each of the first and second pixels. A fourth combined 64-bit register MM6 is generated by performing an unpack operation 1922 on the upper 32 bits of the third 64-bit register MM2, wherein the fourth combined register MM6 comprises a third 8-bit color component for each of the third and fourth pixels.

Specifically, in one embodiment, following the step of placing, step 1706, each register of the set of three 64-bit registers comprises data for one color component of each of four pixels. Therefore, the step of assembling, step 1708, comprises the step of assembling results for the Red and Green color components of four pixels, the step of assembling results for the Blue color components of four pixels, and the step of piecing together the Red, Green, and Blue components to form two 64-bit registers, wherein each register comprises the data for the color components that define each of two pixels.

The step of assembling the results for the Red and Green color components of four pixels comprises performing a bitwise logical OR of the contents of the first MM0 and second MM1 64-bit registers of the set of three 64-bit registers. The resultant 64-bit register 1950 comprises eight 8-bit numbers, or color components, wherein four 8-bit numbers comprise data for the Red color component of each of four pixels and four 8-bit numbers comprise data for the Green color component of each of the four pixels, but the invention is not so limited. In one embodiment, the contents of the resultant 64-bit register 1950 are substituted for the first 64-bit register MM0 of the set of three 64-bit registers. An unpack operation (unpack low from word to doubleword) 1952 is performed on the lower 32 bits of the resultant 64-bit register 1950 to produce a first combined 64bit register MM4 comprising data for the Red color component and the Green color component of each of a first and second pixel. An unpack operation interleaves data by taking one operand from one register and one operand from a corresponding location in another register and placing both operands contiguously in a register. An unpack operation (unpack high from word to doubleword) 1954 is performed on the upper 32 bits of the resultant 64-bit register 1950 to produce a second combined 64-bit register MM5 comprising data for the Red color component and the Green color component of each of a third and fourth pixel.

The step of assembling the results for the Blue color components of four pixels comprises performing an unpack operation (unpack low from word to doubleword) 1920 on the lower 32 bits of the third 64-bit register MM2 to produce a third combined 64-bit register MM3 comprising data for the Blue color component of each of a first and second pixel. An unpack operation (unpack high from word to doubleword) 1922 is performed on the upper 32 bits of the third 64-bit register MM2 to produce a fourth combined 64-bit register MM6 comprising data for the Blue color component of each of a third and fourth pixel.

The step of piecing together the Red, Green, and Blue components to form two 64-bit registers 1998–1999 comprises performing a first logical OR 1924 of the first MM4 and third MM3 combined 64-bit registers to produce a first graphic register 1998 and performing a second logical OR 1926 of the second MM5 and fourth MM6 combined 64-bit registers to produce a second graphic register 1999. The first graphic register 1998 comprises three 8-bit color components that define each of a first 1930 and second 1932 pixel. The second graphic register 1999 comprises three 8-bit color components that define each of a third 1934 and fourth 1936 pixel.

Figure 20A:
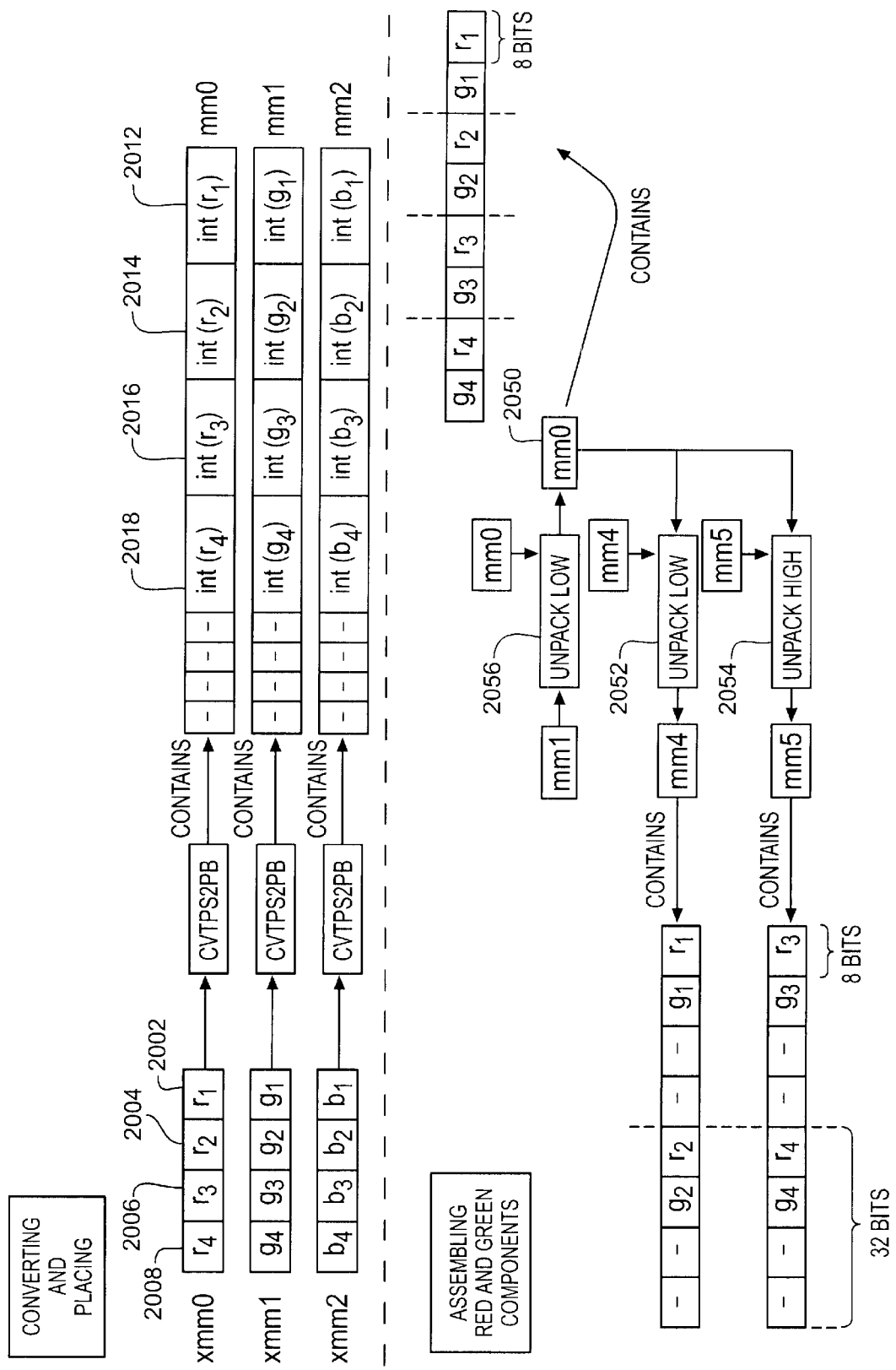
FIG. 20 is a data flow diagram of a parallel conversion of graphic color data using a CVTPS2PB instruction of one embodiment.
Figure 20B:
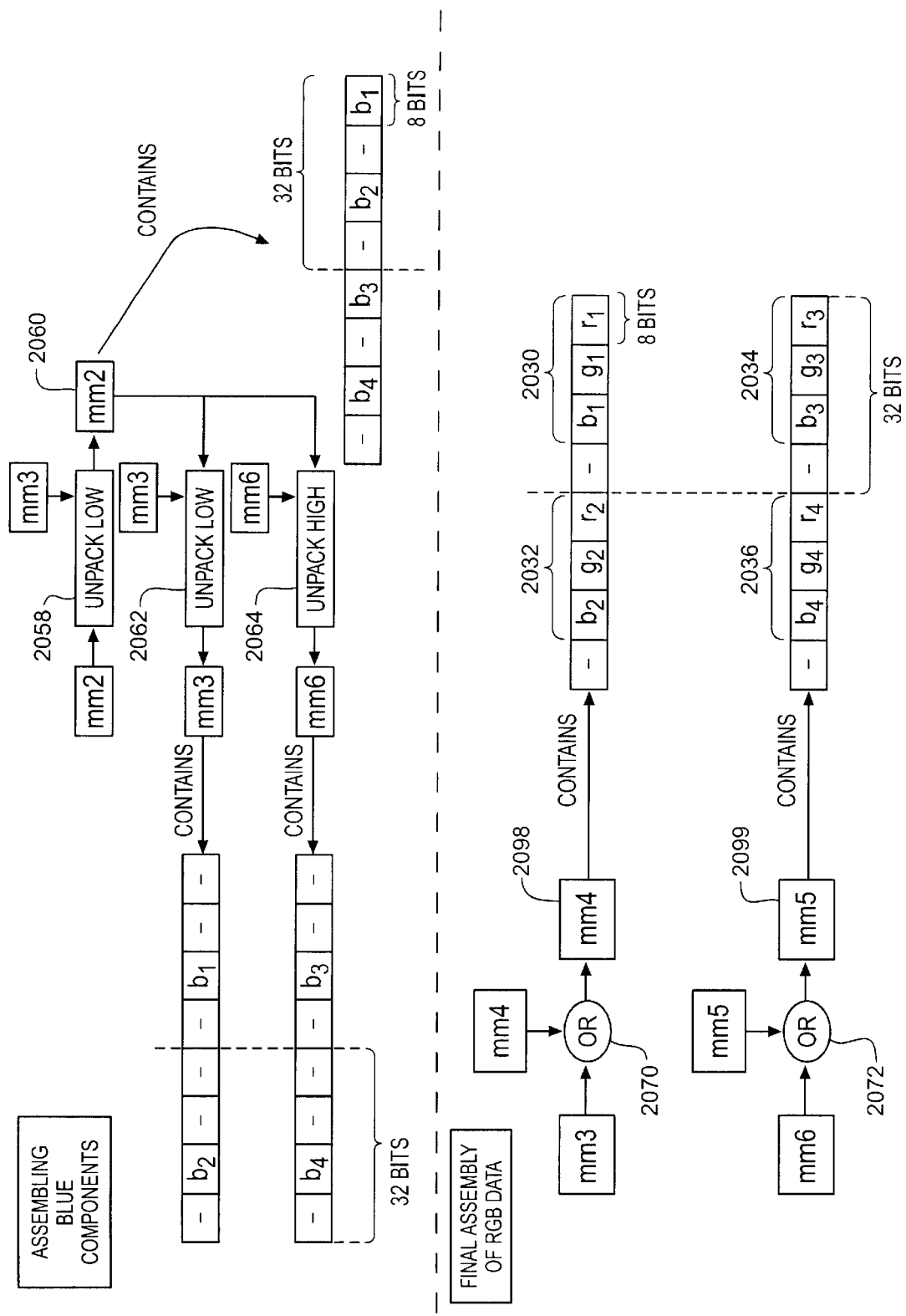

In one embodiment, the CVTPS2PB instruction previously discussed herein is used to convert the color components in the floating point format to color values in an integer format, at step 1704. FIG. 20 is a data flow diagram of the parallel conversion of graphic color data using the CVTPS2PB instruction of one embodiment. Using this instruction, the step of converting, step 1704, comprises converting four 32-bit color components 2002–2008 located in a 128-bit register XMM0 to four 8-bit numbers 2012–2018, or color components, in a 64-bit register MM0. In one embodiment, the aforementioned steps are performed for each of three 128-bit registers XMM0–XMM2, wherein one 128-bit register XMM0 comprises data for a Red color component of each of four pixels, one 128-bit register XMM1 comprises data for a Green color component of each of four pixels, and one 128-bit register XMM2 comprises data for a Blue color component of each of four pixels, but the invention is not so limited. In an alternate embodiment, a fourth 128-bit register (not shown) may comprise transparency data for each of four pixels. In another alternate embodiment, each register of a set of three 128-bit registers may comprise data for the color components of a pixel, and each register of the set of three 64-bit registers may comprise data for the color components that define a pixel.

The step of placing, step 1706, comprises placing the four 8-bit numbers, or color components, in the integer format in a 64-bit register. Therefore, in one embodiment, a first 64-bit register MM0 corresponding to a first 128-bit register XMM0 comprises the Red component data for each of four pixels, a second 64-bit register MM1 corresponding to a second 128-bit register XMM1 comprises the Green component data for each of the four pixels, and a third 64-bit register MM2 corresponding to a third 128-bit register XMM2 comprises the Blue component data for each of the four pixels, but the invention is not so limited.

The step of assembling, step 1708, generally comprises manipulating the contents of the set of three 64-bit registers MM0–MM2, wherein the manipulation results in two 64-bit registers 2098–2099 that each comprise the color components that define each of two pixels. In one embodiment, the manipulation comprises the logical combination of two registers MM0–MM1 of the set of three 64-bit registers MM0–MM2, wherein the combination results in a first MM4 and a second MM5 combined 64-bit register. The first combined register MM4 comprises a first and a second 8-bit color component for each of a first and a second pixel, and the second combined MM5 register comprises a first and a second 8-bit color component for each of a third and a fourth pixel. A third MM3 and a fourth MM6 combined 64-bit register are generated from the logical combination of one register MM2 of the set of three 64-bit registers and a fourth 64-bit register 1910 containing logic zeros. The third combined register MM3 comprises a third 8-bit color component for each of the first and second pixels, and the fourth combined register MM6 comprises a third 8-bit color component for each of the third and fourth pixels.

A logical combination of the first MM4 and third MM3 combined registers results in a first 64-bit graphic register 2098; the first graphic register 2098 comprises three 8-bit color components 2030 that define a color of a first pixel and three 8-bit color components 2032 that define a color of a second pixel. A logical combination of the second MM5 and fourth MM6 combined registers results in a second 64-bit graphic register 2099; the second graphic register 2099 comprises three 8-bit color components 2034 that define a color of a third pixel and three 8-bit color components 2036 that define a color of a fourth pixel. In an alternate embodiment, each of the combined registers may comprise two 8-bit transparency components for each of the corresponding pixels, and each of the graphic registers may comprise an 8-bit transparency component corresponding to each represented pixel.

Specifically, in one embodiment, following the step of placing, step 1706, each register of the set of three 64-bit registers MM0–MM2 comprises data for one color component of each of four pixels. Therefore, the step of assembling, step 1708, comprises the step of assembling results for the Red and Green color components of four pixels, the step of assembling results for the Blue color components of four pixels, and the step of piecing together the Red, Green, and Blue components to form two 64-bit registers 2098–2099, wherein each register comprises the data for the color components that define each of two pixels.

The step of assembling the results for the Red and Green color components of four pixels comprises performing an unpack operation (unpack low from byte to word) 2056 on the contents of the first MM0 and second MM1 64-bit registers of the set of three 64-bit registers MM0–MM2. The resultant 64-bit register 2050 comprises eight 8-bit numbers, or color components, wherein four 8-bit numbers comprise data for the Red color component of each of four pixels and four 8bit numbers comprise data for the Green color component of each of the four pixels, but the invention is not so limited. In one embodiment, the contents of the resultant 64-bit register 2050 are substituted for the first 64-bit register MM0 of the set of three 64-bit registers MM0–MM2. An unpack operation (unpack low from word to doubleword) 2052 is performed on the lower 32 bits of the resultant 64-bit register 2050 to produce a first combined 64-bit register MM4 comprising data for the Red color component and the Green color component of each of a first and second pixel. An unpack operation (unpack high from word to doubleword) 2054 is performed on the upper 32 bits of the resultant 64-bit register 2050 to produce a second combined 64-bit register MM5 comprising data for the Red color component and the Green color component of each of a third and fourth pixel.

The step of assembling the results for the Blue color components of four pixels comprises performing an unpack operation (unpack low from byte to word) 2058 on the contents of the third 64-bit register and a fourth 64-bit register MM3 containing logical zeros. The resultant 64-bit register 2060 comprises four 8-bit numbers that are the data for the Blue component of each of the four pixels. In one embodiment, the contents of the resultant 64-bit register 2060 are substituted for the third 64-bit register MM2 of the set of three 64-bit registers MM0–MM2. An unpack operation (unpack low from word to doubleword) 2062 is performed on the lower 32 bits of the resultant 64-bit register 2060; the result of the unpack replaces the contents of the fourth 64-bit register MM3, wherein the fourth 64-bit register MM3 now comprises data for the Blue color component of each of a first and second pixel. An unpack operation (unpack high from word to doublewords) 2064 is performed on the upper 32 bits of the resultant 64-bit register 2060 to produce a seventh 64-bit register MM6 comprising data for the Blue color component of each of a third and fourth pixel.

The step of piecing together the Red, Green, and Blue components to form two 64-bit registers 2098–2099 comprises performing a first logical OR 2070 of the first MM4 and third MM3 combined 64-bit registers to produce a first graphic register 2098 and performing a second logical OR 2072 of the second MM5 and fourth MM6 combined 64-bit registers to produce a second graphic register 2099. The first graphic register 2098 comprises three 8-bit color components that define each of a first 2030 and second 2032 pixel. The second graphic register 2099 comprises three 8-bit color components that define each of a third 2034 and fourth 2036 pixel.

While the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. An apparatus comprising:

a decoder to decode instructions, and a circuit coupled with the decoder, the circuit in response to at least one decoded instruction to convert a first plurality of numbers in an integer format that are stored in a packed format in a register belonging to a first set of architectural registers to a second plurality of numbers in a floating-point format and to store the second plurality of numbers in a packed format in a register belonging to a second set of architectural registers.

2. The apparatus of claim 1, wherein the circuit is a circuit to convert by:
   storing the first plurality of numbers in the integer format in the packed format in the register belonging to the first set of architectural registers; and
   storing the second plurality of numbers in a lowest plurality of segments in the packed format in the register belonging to the second set of architectural registers and preserving an upper plurality of segments of the register unchanged.

3. The apparatus of claim 1, wherein the first plurality of numbers is two and the second plurality of numbers is two.

4. The apparatus of claim 1, wherein the circuit is a circuit to convert two 32-bit signed integers that are stored in a 64-bit packed integer register to two least significant single precision floating-point numbers and store the two least significant single precision floating-point numbers in a 128-bit packed register.

5. The apparatus of claim 1, wherein the circuit is a circuit to round based on a rounding mode indicated by a control and status register.

6. The apparatus of claim 1, wherein the circuit is a circuit to zero a plurality of most significant numbers in a plurality of upper segments of the register belonging to the second set of architectural registers.

7. The apparatus of claim 1, wherein the second plurality of numbers comprises four numbers.

8. The apparatus of claim 1, wherein the circuit is a circuit to convert two signed integers to two least significant floating-point numbers by implicitly truncating according to a truncate mode indicated by the at least one decoded instruction.

9. The apparatus of claim 1, wherein the first set of architectural registers comprises a plurality of 64-bit registers, and wherein the second set of architectural registers comprises a plurality of 128-bit registers.

10. The apparatus of claim 1, wherein the second plurality of numbers comprises four 32-bit numbers.

11. An apparatus, comprising:
    a first storage area to store packed data, the first storage area representing a register in a first set of architectural registers;
    a second storage area to store packed data, the second storage area representing a register in a second set of architectural registers; and
    logic to convert a first plurality of numbers in an integer format that are stored in the first storage area to a second plurality of numbers in a floating-point format and to store the second plurality of numbers in the second storage area.

12. The apparatus of claim 11, wherein the logic comprises an integrated circuit.

13. The apparatus of claim 11, wherein the logic comprises a combination of an integrated circuit and software.

14. The apparatus of claim 11, wherein the logic is logic to convert by:
    storing the first plurality of numbers in the integer format in the first storage area in a packed format; and
    storing the second plurality of numbers in a lowest plurality of segments of the second storage area in a packed format and preserving a plurality of upper segments of the second storage area unchanged.

15. The apparatus of claim 11, wherein the first plurality of numbers is two and the second plurality of numbers is two.

16. The apparatus of claim 11, wherein the logic is logic to convert two 32-bit signed integers in a packed format in a 64-bit integer register to two single precision floating-point numbers and store the two single precision floating-point numbers in a packed format in two least significant segments of a 128-bit register.

17. The apparatus of claim 11, wherein the logic is logic to round based on a rounding mode indicated by a control and status register.

18. The apparatus of claim 11, wherein the logic is logic to zero a plurality of most significant numbers in a plurality of upper segments of the second storage area.

19. The apparatus of claim 11, wherein the second plurality of numbers comprises four numbers.

20. The apparatus of claim 11, wherein the logic is logic to convert two signed integers to two least significant floating-point numbers by implicitly truncating according to a truncate mode indicated by at least one decoded instruction.

21. The apparatus of claim 11, wherein the first storage area comprises eight 64-bit registers, and wherein the second storage area comprises eight 128-bit registers.

22. The apparatus of claim 11, wherein the second plurality of numbers comprises four 32-bit numbers.

23. A method comprising:
    converting a plurality of numbers in a packed floating-point format in a register belonging to a first set of architectural registers to a plurality of numbers in an integer format; and
    placing the plurality of numbers in the integer format in a packed format in a register belonging to a second set of architectural registers.

24. The method of claim 23, wherein converting comprises:
    accessing rounding mode bits from a register holding a conversion instruction; and
    rounding a number in the floating-point format according to a rounding mode indicated by the rounding mode bits.

25. The method of claim 24, wherein the rounding mode is a truncate mode.

26. The method of claim 23, wherein converting comprises:
    accessing rounding mode bits encoded in a conversion instruction; and
    rounding a number in the floating-point format according to a rounding mode indicated by the rounding mode bits.

27. The method of claim 23, wherein the plurality of numbers in the floating-point format comprises four numbers, and wherein converting includes converting the four numbers by:
    converting a lower two floating-point numbers of the four numbers to two numbers in the integer format by using a first instantiation of an instruction;
    shuffling the operands; and
    converting a remaining two floating-point numbers of the four numbers to two numbers in the integer format by using a second instantiation of an instruction.

28. The method of claim 23, wherein converting comprises converting two least significant floating-point numbers to two signed integers by implicitly truncating according to a truncate mode indicated by a conversion instruction.

29. The method of claim 23, wherein the first set of architectural registers comprise a plurality of 128-bit registers, and wherein the second set of architectural registers comprise a plurality of 64-bit registers.

30. The method of claim 23, wherein the plurality of numbers in the integer format comprises four 8-bit numbers.

31. The method of claim 23, wherein the packed format allows two separate numbers to be stored at the same time.

32. An apparatus comprising:

a decoder to decode instructions, and a circuit coupled with the decoder, the circuit in response to at least one decoded instruction to convert a first plurality of numbers in a floating-point format that are stored in a packed format in a register belonging to a first set of architectural registers to a second plurality of numbers in an integer format and to store the second plurality of numbers in a packed format in a register belonging to a second set of architectural registers.

33. The apparatus of claim 32, wherein the circuit is a circuit to convert by:

accessing rounding mode bits from a register holding a conversion instruction; and rounding the plurality of numbers in the integer format according to a rounding mode indicated by the rounding mode bits.

34. The apparatus of claim 32, wherein the plurality of numbers in the floating-point format comprises four numbers.

35. The apparatus of claims 32, wherein the circuit is a circuit to convert two least significant floating-point numbers to two signed integers by implicitly truncating according to a truncate mode indicated by the at least one decoded instruction.

36. The apparatus of claim 32, wherein the first set of architectural registers comprise a plurality of 128-bit registers, and wherein the second set of architectural registers comprise a plurality of 64-bit registers.

37. The apparatus of claim 32, wherein the circuit to store the second plurality of numbers in the packed format in the register belonging to the second set of architectural registers is a circuit to store the second plurality of numbers in the packed format in a register belonging to a second set of architectural registers that is aliased onto a memory space of a plurality of scalar registers.

38. The apparatus of claim 32, wherein the plurality of numbers in the integer format comprises four 16-bit numbers.

39. The apparatus of claim 32, wherein the circuit is a circuit to zero a plurality of most significant numbers in a plurality of upper segments of the register belonging to the second set of architectural registers.

40. As An apparatus, comprising:

a first storage area to store packed data, the first storage area representing a register in a first set of architectural registers;

a second storage area to store packed data, the second storage area representing a register in a second set of architectural registers; and logic to convert a first plurality of numbers in a floating-point format that are stored in the first storage area to a second plurality of numbers in an integer format and to store the second plurality of numbers in the second storage area.

41. The apparatus of claim 40, wherein the logic comprises an integrated circuit.

42. The apparatus of claim 40, wherein the logic comprises a combination of an integrated circuit and software.

43. The apparatus of claim 40, wherein the logic is logic to convert by:

storing the first plurality of numbers in the floating-point format in the first storage area in a packed format; and storing the second plurality of numbers in a lowest plurality of segments of the second storage area in a packed format and preserving a plurality of upper segments of the second storage area unchanged.

44. The apparatus of claim 40, wherein the first plurality of numbers is two and the second plurality of number is two.

45. The apparatus of claim 40, wherein the logic is logic to convert two single precision floating-point numbers in a packed format in a 128-bit floating-point register to two 32-bit signed integers and store the two 32-bit signed integers in a packed format in two least significant segments of a 64-bit register.

46. The apparatus of claim 40, wherein the logic is logic to round based on a rounding mode indicated by a control and status register.

47. The apparatus of claim 40, wherein the logic is logic to zero a plurality of most significant numbers in a plurality of upper segments of the second storage area.

48. The apparatus of claim 40, wherein the second plurality of numbers comprises four numbers.

49. The apparatus of claim 40, wherein the logic is logic to convert two least significant floating-point numbers to two signed integers by implicitly truncating according to a truncate mode indicated by at least one decoded instruction.

50. The apparatus of claim 40, wherein the first storage area comprises eight 128-bit registers, and wherein the second storage area comprises eight 64-bit registers.

51. The apparatus of claim 40, wherein the second plurality of numbers comprises four 16-bit numbers.

52. The apparatus of claim 40, wherein the plurality of numbers in the integer format are converted from a plurality of numbers in the floating-point format stored in the lowest adjacent segments of the first storage area.

53. An apparatus, comprising:

a first register belonging to a first set of architectural registers;

a second register belonging to a second set of architectural registers;

logic means to convert at least one number in a floating-point format stored in the first register to at least one number in an integer format and store the at least one number in the second register in a packed format.

54. The apparatus of claim 53, further comprising logic means to assemble color components for pixels from the at least one number in the integer format in the second register.

55. The apparatus of claim 53, wherein the logic means to convert is a logic means to convert four numbers in the floating-point format in the first register to two numbers in the integer format in the second register belonging to the second set of architectural registers and two numbers in the integer format in a third register belonging to the second set of architectural registers.

* * * * *

UNITED STATES PATENT AND TRADEMARK OFFICE
CERTIFICATE OF CORRECTION

PATENT NO. : 6,502,115 B2
DATED : December 31, 2002
INVENTOR(S) : Abdallah et al.

It is certified that error appears in the above-identified patent and that said Letters Patent is hereby corrected as shown below:

<u>Column 3,</u>
Line 33, delete "CVTP12PS", insert -- CVTPI2PS --.

Signed and Sealed this

Twenty-fifth Day of March, 2003

JAMES E. ROGAN
*Director of the United States Patent and Trademark Office*